US012688885B2

(12) United States Patent
Lee

(10) Patent No.: US 12,688,885 B2
(45) Date of Patent: Jul. 21, 2026

(54) SEMICONDUCTOR MEMORY DEVICE AND METHOD OF OPERATING THE SAME

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 417 days.

(21) Appl. No.: 18/102,525

(22) Filed: Jan. 27, 2023

(65) Prior Publication Data

US 2024/0046984 A1     Feb. 8, 2024

(30) Foreign Application Priority Data

Aug. 3, 2022     (KR) ........................ 10-2022-0096440

(51) Int. Cl.
| | |
|---|---|
| *G11C 11/56* | (2006.01) |
| *G11C 16/04* | (2006.01) |
| *G11C 16/10* | (2006.01) |
| *G11C 16/26* | (2006.01) |
| *G11C 16/34* | (2006.01) |

(52) U.S. Cl.
CPC ...... *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01); *G11C 16/3459* (2013.01)

(58) Field of Classification Search
CPC .................... G11C 2211/5641; G11C 16/3459
See application file for complete search history.

(56) References Cited

U.S. PATENT DOCUMENTS

| | | | |
|---|---|---|---|
| 2015/0055411 A1* | 2/2015 | Kim ................... | G11C 16/0483 |
| | | | 365/185.02 |
| 2016/0322087 A1* | 11/2016 | Na ........................ | G11C 16/26 |

FOREIGN PATENT DOCUMENTS

| | | |
|---|---|---|
| KR | 1020120110672 A | 10/2012 |
| KR | 1020210002190 A | 1/2021 |

* cited by examiner

*Primary Examiner* — Uyen Smet

(74) *Attorney, Agent, or Firm* — WILLIAM PARK AND ASSOCIATES LTD.

(57) ABSTRACT

A semiconductor memory device and a method of operating the same are provided herein. The semiconductor memory device includes first and second pages, a peripheral circuit, and a control logic. The first page includes first memory cells, each storing N bits. The second page includes second memory cells, each storing $N-1$ bit. The peripheral circuit performs a first program operation that results in a threshold voltage of each first memory cell to be included in one of $2^N$ states and performs a second program operation that results in a threshold voltage of each second memory cell to be included in one of $2^{N-1}$ states. The control logic controls the first and second program operations through the peripheral circuit and controls the peripheral circuit to perform the second program operation by using at least one, but not all of a plurality of verify voltages that are used in the first program operation.

10 Claims, 21 Drawing Sheets

WL8 — PAGE 8 (TLC-Programmed)

WL7 — PAGE 7 (SLC-Programmed)

WL6 — PAGE 6 (TLC-Programmed)

WL5 — PAGE 5 (TLC-Programmed)

WL4 — PAGE 4 (MLC-Programmed)

WL3 — PAGE 3 (TLC-Programmed)

WL2 — PAGE 2 (TLC-Programmed)

WL1 — PAGE 1 (TLC-Programmed)

FIG. 5

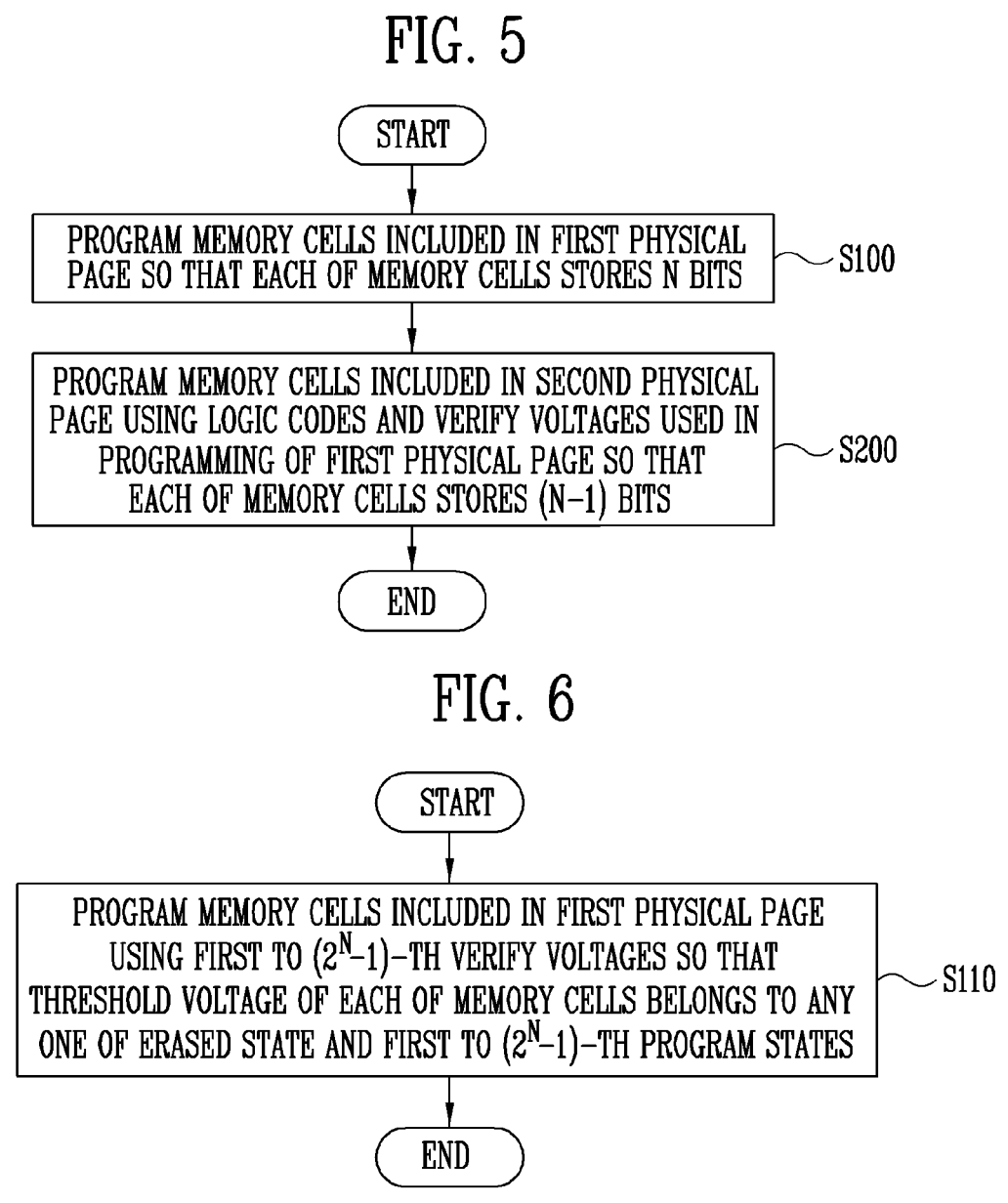

START

PROGRAM MEMORY CELLS INCLUDED IN FIRST PHYSICAL PAGE SO THAT EACH OF MEMORY CELLS STORES N BITS ～S100

PROGRAM MEMORY CELLS INCLUDED IN SECOND PHYSICAL PAGE USING LOGIC CODES AND VERIFY VOLTAGES USED IN PROGRAMMING OF FIRST PHYSICAL PAGE SO THAT EACH OF MEMORY CELLS STORES (N-1) BITS ～S200

END

FIG. 6

START

PROGRAM MEMORY CELLS INCLUDED IN FIRST PHYSICAL PAGE USING FIRST TO $(2^N-1)$-TH VERIFY VOLTAGES SO THAT THRESHOLD VOLTAGE OF EACH OF MEMORY CELLS BELONGS TO ANY ONE OF ERASED STATE AND FIRST TO $(2^N-1)$-TH PROGRAM STATES ～S110

END

Figure 9:
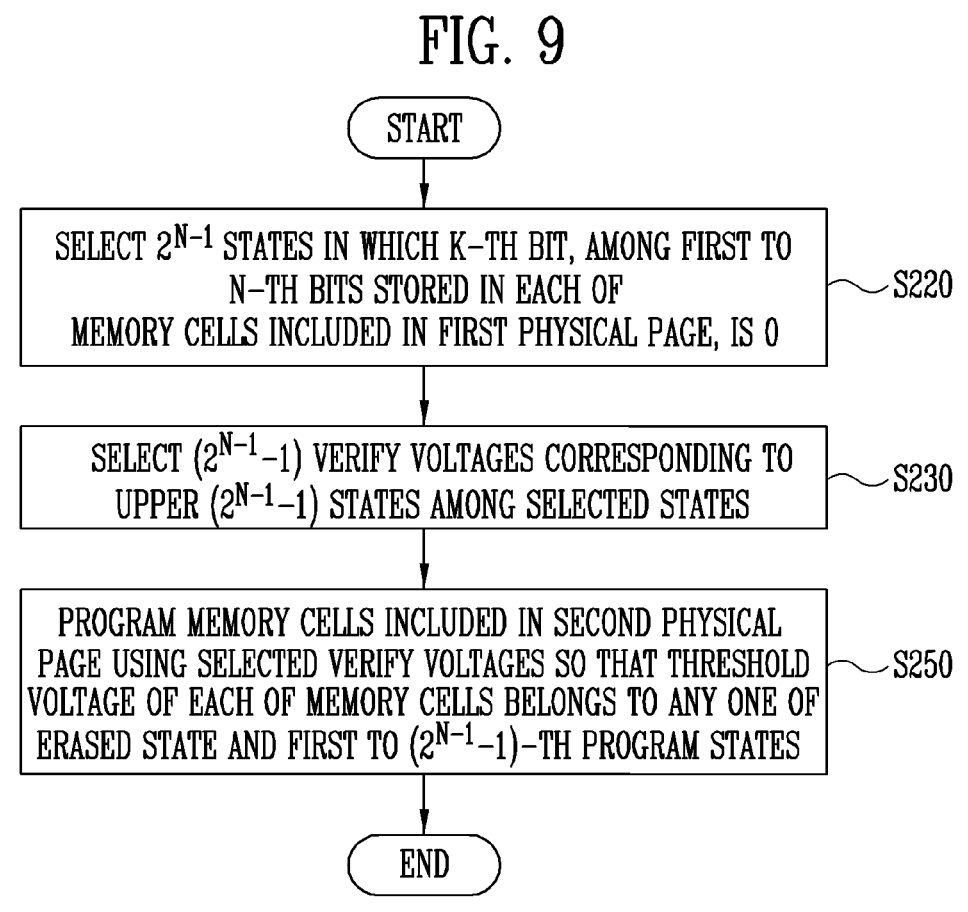

START

SELECT $2^{N-1}$ STATES IN WHICH K-TH BIT, AMONG FIRST TO N-TH BITS STORED IN EACH OF MEMORY CELLS INCLUDED IN FIRST PHYSICAL PAGE, IS 0 ⟩— S220

SELECT $(2^{N-1}-1)$ VERIFY VOLTAGES CORRESPONDING TO UPPER $(2^{N-1}-1)$ STATES AMONG SELECTED STATES ⟩— S230

PROGRAM MEMORY CELLS INCLUDED IN SECOND PHYSICAL PAGE USING SELECTED VERIFY VOLTAGES SO THAT THRESHOLD VOLTAGE OF EACH OF MEMORY CELLS BELONGS TO ANY ONE OF ERASED STATE AND FIRST TO $(2^{N-1}-1)$-TH PROGRAM STATES ⟩— S250

END

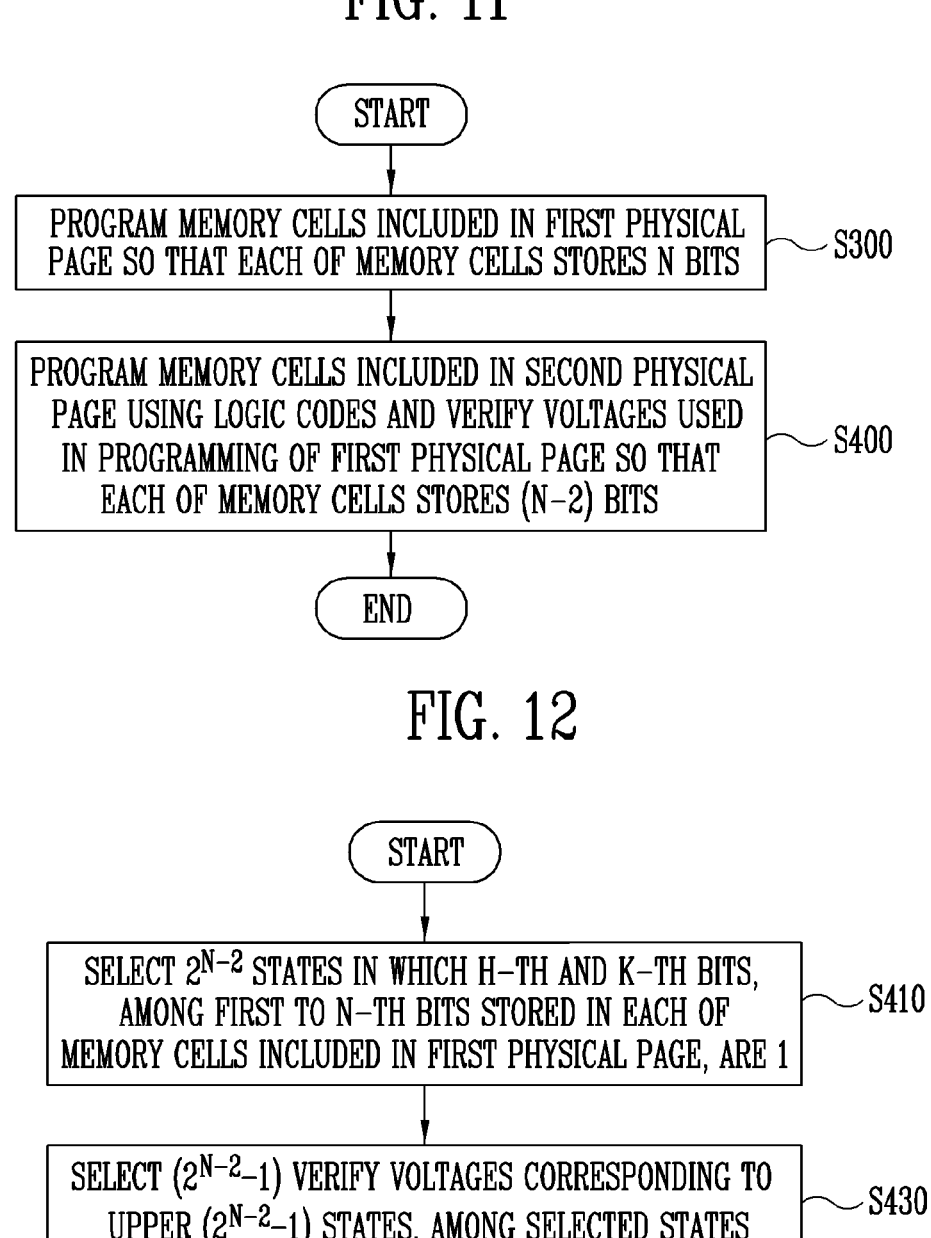

START

PROGRAM MEMORY CELLS INCLUDED IN FIRST PHYSICAL PAGE SO THAT EACH OF MEMORY CELLS STORES N BITS — S300

PROGRAM MEMORY CELLS INCLUDED IN SECOND PHYSICAL PAGE USING LOGIC CODES AND VERIFY VOLTAGES USED IN PROGRAMMING OF FIRST PHYSICAL PAGE SO THAT EACH OF MEMORY CELLS STORES (N-2) BITS — S400

END

FIG. 12

START

SELECT $2^{N-2}$ STATES IN WHICH H-TH AND K-TH BITS, AMONG FIRST TO N-TH BITS STORED IN EACH OF MEMORY CELLS INCLUDED IN FIRST PHYSICAL PAGE, ARE 1 — S410

SELECT $(2^{N-2}-1)$ VERIFY VOLTAGES CORRESPONDING TO UPPER $(2^{N-2}-1)$ STATES, AMONG SELECTED STATES — S430

PROGRAM MEMORY CELLS INCLUDED IN SECOND PHYSICAL PAGE USING SELECTED VERIFY VOLTAGES SO THAT THRESHOLD VOLTAGE OF EACH OF MEMORY CELLS BELONGS TO ANY ONE OF ERASED STATE AND FIRST TO $(2^{N-2}-1)$-TH PROGRAM STATES — S450

END

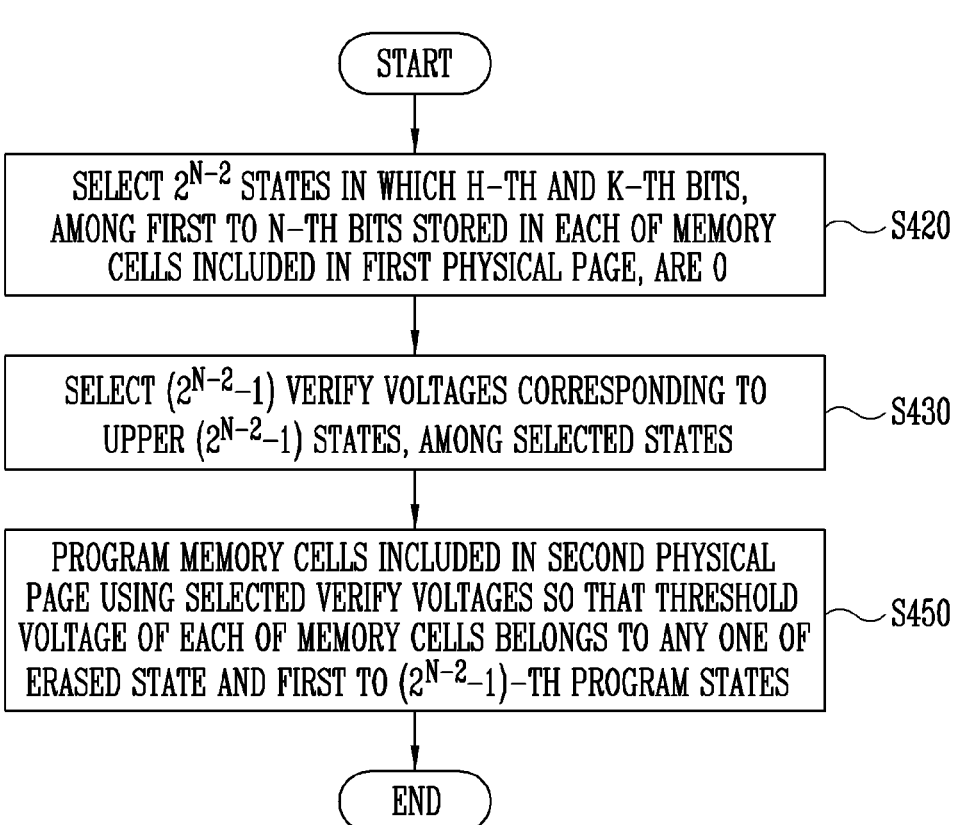

START

SELECT $2^{N-2}$ STATES IN WHICH H-TH AND K-TH BITS, AMONG FIRST TO N-TH BITS STORED IN EACH OF MEMORY CELLS INCLUDED IN FIRST PHYSICAL PAGE, ARE 0    ⌐S420

SELECT $(2^{N-2}-1)$ VERIFY VOLTAGES CORRESPONDING TO UPPER $(2^{N-2}-1)$ STATES, AMONG SELECTED STATES    ⌐S430

PROGRAM MEMORY CELLS INCLUDED IN SECOND PHYSICAL PAGE USING SELECTED VERIFY VOLTAGES SO THAT THRESHOLD VOLTAGE OF EACH OF MEMORY CELLS BELONGS TO ANY ONE OF ERASED STATE AND FIRST TO $(2^{N-2}-1)$-TH PROGRAM STATES    ⌐S450

END

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0096440, filed on Aug. 3, 2022, in the Korean Intellectual Property Office, the entire disclosure of which is incorporated herein by reference.

BACKGROUND

1. Technical Field

Various embodiments of the present disclosure generally relate to an electronic device, and more particularly to a semiconductor memory device and a method of operating the semiconductor memory device.

2. Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced.

SUMMARY

An embodiment of the present disclosure may provide for a semiconductor memory device. The semiconductor memory device may include a first page, a second page, a peripheral circuit, and a control logic. The first page may include first memory cells, each storing N bits. The second page may include second memory cells, each storing N−1 bit. The peripheral circuit may be configured to perform a first program operation that results in a threshold voltage of each of the first memory cells to be included in any one of $2^N$ states and configured to perform a second program operation that results in a threshold voltage of each of the second memory cells to be included in any one of $2^{N-1}$ states. The control logic may be configured to control the first and second program operations through the peripheral circuit. The control logic may be configured to control the peripheral circuit to perform the second program operation by using at least one, but not all, of a plurality of verify voltages that are used in the first program operation. Here, N may be a natural number greater than or equal to 2.

An embodiment of the present disclosure may provide for a method of operating a semiconductor memory device. The method may perform a first program operation on a first page including first memory cells, each storing N bits and may perform a second program operation on a second page including second memory cells, each storing N-M bits, using at least one, but not all, of a plurality of verify voltages that are used in the first program operation. Here, N may be a natural number greater than or equal to 2, and M may be a natural number that is greater than or equal to 1 and less than N.

BRIEF DESCRIPTION OF THE DRAWINGS

FIG. 5 is a flowchart illustrating a method of operating a semiconductor memory device according to an embodiment of the present disclosure, FIG. 6 is a flowchart illustrating an embodiment of step S100 of FIG. 5.

FIG. 8A is a diagram illustrating steps S210 and S230 of FIG. 7.

FIG. 8B is a diagram illustrating step S250 of FIG. 7.

FIG. 9 is a flowchart illustrating an embodiment of step S200 of FIG. 5,

FIG. 10A is a diagram illustrating steps S220 and S230 of FIG. 9.

FIGS. 10B and 10C are diagrams illustrating step 3250 of FIG. 9.

FIG. 11 is a flowchart illustrating a method of operating a semiconductor memory device according to an embodiment of the present disclosure.

FIG. 12 is a flowchart illustrating an embodiment of step S400 of FIG. 11.

FIG. 13B is a diagram illustrating an example of step S450 of FIG. 12.

FIG. 14A is a diagram illustrating examples of steps S410 and S430 of FIG. 12.

FIG. 14B is a diagram illustrating an example of step S450 of FIG. 12.

FIG. 15 is a flowchart illustrating an embodiment of step S400 of FIG. 11.

FIGS. 16B and 16C are diagrams illustrating step S450 of FIG. 15.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a semiconductor memory device having improved read performance and a method of operating the semiconductor memory device.

Figure 1:
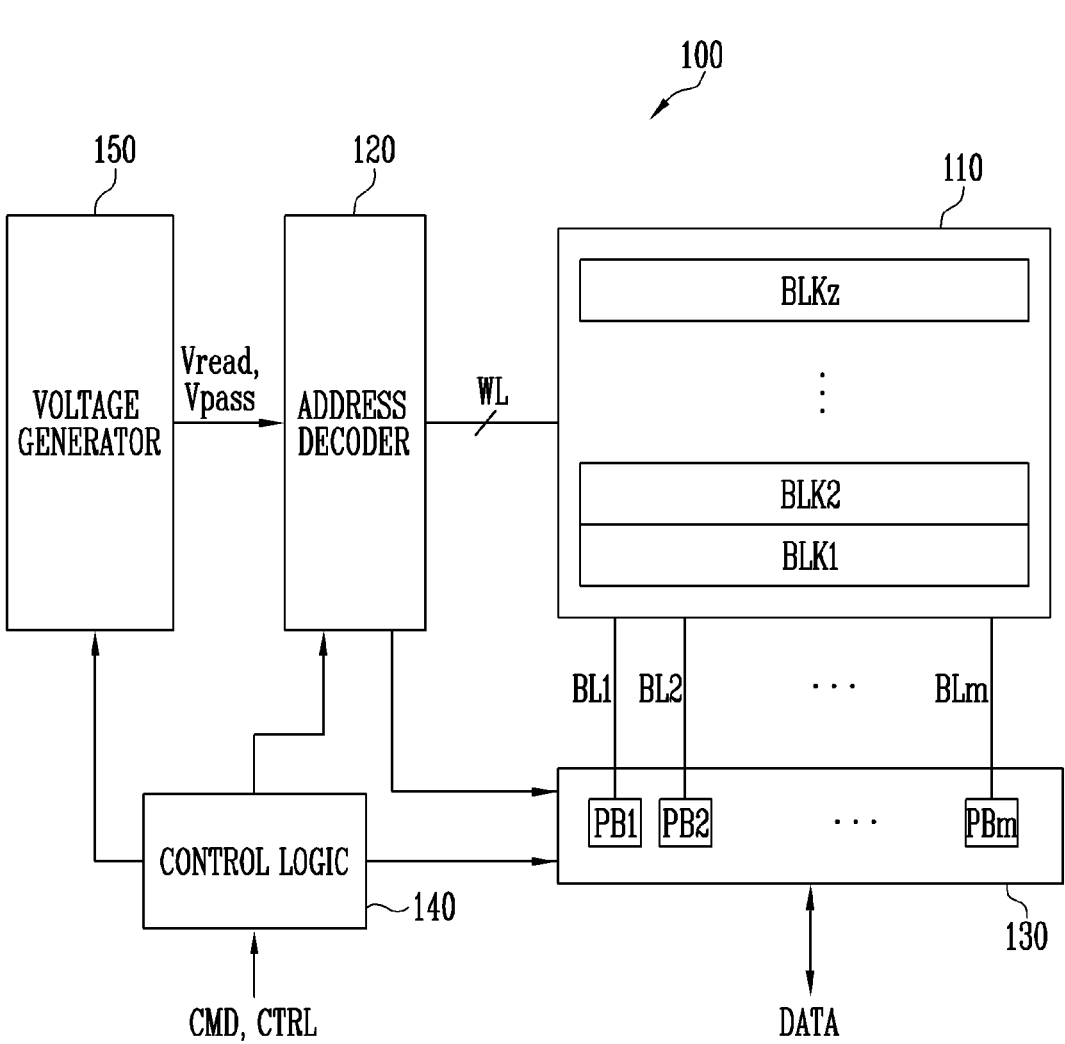
FIG. 1 is a diagram illustrating a semiconductor memory device according to an embodiment of the present disclosure.

FIG. 1 is a diagram illustrating a semiconductor memory device according to an embodiment of the present disclosure.

Referring to FIG. 1, a semiconductor memory device 100 according to an embodiment of the present disclosure may include a memory cell array 110, an address decoder 120, a read and write circuit 130, a control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Meanwhile, each of the memory cells included in the memory cell array may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores two bits of data. In an embodiment, each of the memory cells included in the memory cell array 110 may be a triple-level cell (TLC), which stores three bits of data. In an embodiment, each of the memory cells included in the memory cell array 110 may be a quad-level cell (QLC), which stores four bits of data. In accordance with an embodiment, the memory cell array 110 may include a plurality of memory cells, each of which stores five or more bits of data.

The address decoder 120 may be coupled to the memory cell array 110 through the word lines WL. The address decoder 120 may be operated under the control of the control logic 140. The address decoder 120 may receive addresses through an input/output buffer (not illustrated) that is provided in the semiconductor memory device 100.

The address decoder 120 may decode the block address, among the received addresses. The address decoder 120 may select at least one memory block according to the decoded block address. When a read voltage apply operation is performed during a read operation, the address decoder 120 may apply a read voltage Vread, generated by the voltage generator 150, to a selected word line of a selected memory block and may apply a pass voltage Vpass to the remaining word lines, that is, unselected word lines. Further, during a program verify operation, the address decoder 120 may apply a verify voltage, generated by the voltage generator 150, to the selected word line of the selected memory block and may apply the pass voltage Vpass to the unselected word lines.

The address decoder 120 may decode the column address, among the received addresses. The address decoder 120 may transmit the decoded column address to the read and write circuit 130.

Each of the read and program operations of the semiconductor memory device 100 may be performed on a page-by-page basis. Addresses that are received in response to requests for the read and program operations may include a block address, a row address, and a column address. The address decoder 120 may select one memory block and one word line according to the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBM. The read and write circuit 130 may be operated as a "read circuit" during a read operation on the memory cell array 110 and as a "write circuit" during a write operation. The plurality of page buffers PB1 to PBM may be coupled to the memory cell array 110 through the bit lines BL1 to BLm. In order to sense threshold voltages of the memory cells during a read operation and a program verify operation, each of the page buffers PB1 to PBM may sense, through a sensing node, a change in the amount of flowing current depending on the program state of a corresponding memory cell and latch the sensed change as sensing data while continuously supplying a sensing current to the bit lines that are coupled to the memory cells. The read and write circuit 130 may be operated in response to page buffer control signals output from the control logic 140.

During a read operation, the read and write circuit 130 may sense data stored in the memory cells and temporarily store read data and may then output data DATA to the input/output buffer (not illustrated) of the semiconductor memory device 100. In an example embodiment, the read and write circuit 130 may include a column select circuit or the like as well as the page buffers (or page registers).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Furthermore, the control logic 140 may output a control signal for controlling a precharge potential level at the sensing node of the plurality of page buffers PB1 to PBM. The control logic 140 may control the read and write circuit 130 to perform a read operation on the memory cell array 110.

The voltage generator 150 may generate the read voltage Vread and the pass voltage Vpass that are required for a read operation in response to the control signal output from the control logic 140. The voltage generator 150 may include a plurality of pumping capacitors for receiving the internal supply voltage so as to generate a plurality of voltages having various voltage levels and may generate a plurality of voltages by selectively enabling the plurality of pumping capacitors under the control of the control logic 140.

The address decoder 120, the read and write circuit 130, and the voltage generator 150 may function as a "peripheral circuit", which performs a read operation, a write operation, and an erase operation on the memory cell array 110. The peripheral circuits may perform the read operation, the write operation, and the erase operation on the memory cell array 110 under the control of the control logic 140.

Figure 2:
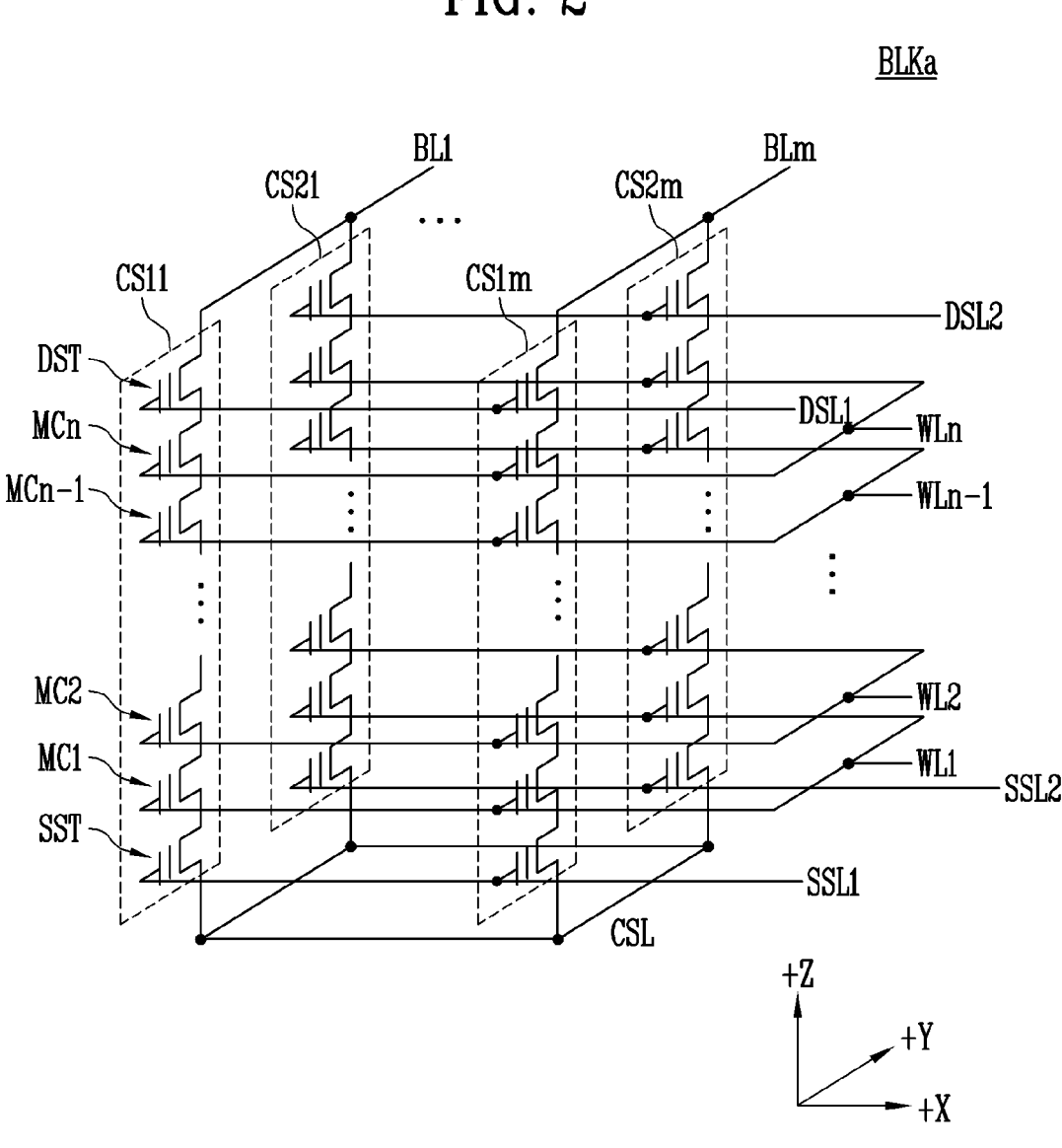
FIG. 2 is a circuit diagram illustrating any one memory block BLKa of memory blocks BLK1 to BLKz of FIG. 1.

FIG. 2 is a circuit diagram illustrating any one memory block BLKa of memory blocks BLK1 to BLKz of FIG. 1.

Referring to FIG. 2, the memory block BLKa may include a plurality of cell strings CS11 to CS1M and CS21 to CS2M. In the memory block BLKa, m cell strings may be arranged in a row direction (i.e., a positive (+) X direction). In FIG. 2, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1M and CS21 to CS2M may include at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string may be coupled between a common source line CSL and the memory cells MC1 to MCn.

In an embodiment, the source select transistors of cell strings arranged in the same row may be coupled to a source select line extending in a row direction, and the source select transistors of cell strings that are arranged in different rows may be coupled to different source select lines. In FIG. 2, the source select transistors of the cell strings CS11 to CS1M in a first row may be coupled to a first source select line SSL1. The source select transistors of the cell strings CS21 to CS2M in a second row may be coupled to a second source select line SSL2.

In an embodiment, the source select transistors of the cell strings CS11 to CS1M and CS21 to CS2M may be coupled in common to one source select line.

The first to n-th memory cells MC1 to MCn in each cell string may be coupled in series between the source select transistor SST and the drain select transistor DST. Gates of the first to n-th memory cells MC1 to MCn may be respectively coupled to first to n-th word lines WL1 to WLn.

The drain select transistor DST of each cell string may be coupled between the corresponding bit line and the memory cells MC1 to MCn. The drain select transistors DST of cell strings that are arranged in the row direction may be coupled to a drain select line extending in the row direction. The drain select transistors of the cell strings CS11 to CS1M in the first row may be coupled to a first drain select line DSL1. The drain select transistors of the cell strings CS21 to CS2M in the second row may be coupled to a second drain select line DSL2.

Cell strings that are arranged in the column direction may be coupled to bit lines that extend in the column direction. In FIG. 2, the cell strings CS11 and CS21 in a first column may be coupled to a first bit line BL1. The cell strings CS1M and CS2M in an m-th column may be coupled to an m-th bit line BLm.

Memory cells that are coupled to the same word line in cell strings that are arranged in the row direction may form one page. For example, memory cells that are coupled to the first word line WL1, among the cell strings CS11 to CS1M in the first row, may form one page. Memory cells that are coupled to the first word line WL1, among the cell strings CS21 to CS2M in the second row, may form one additional page. Cell strings that are arranged in the direction of one row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1M or CS21 to CS2M that are arranged in a row direction, may be coupled to respective is even bit lines. Odd-numbered cell strings, among the cell strings CS11 to CS1M or CS21 to CS2M that are arranged in the row direction, may be coupled to respective odd bit lines.

In an embodiment, one or more of first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines that are coupled to respective dummy memory cells.

In FIG. 2, the memory block BLKa included in the memory cell array having a 3D structure is illustrated. However, the present disclosure is not limited thereto, and the semiconductor memory device may include a memory cell array having a 2D structure.

Figure 3A:
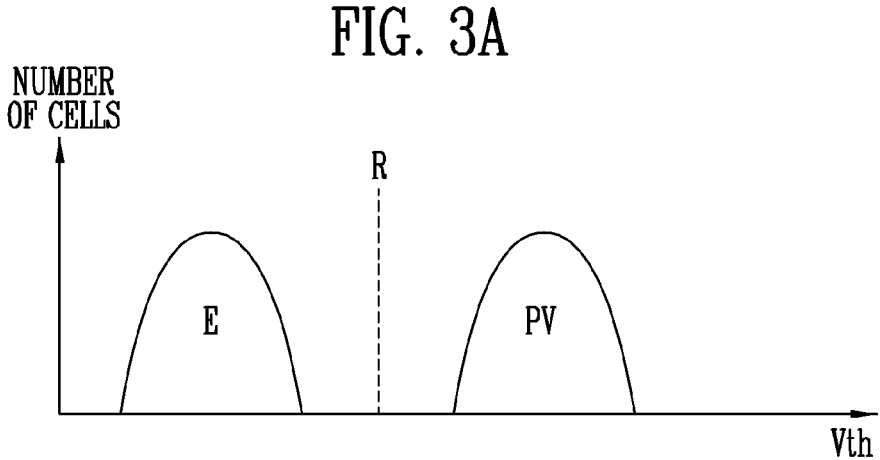
FIGS. 3A, 3B, and 3C are diagrams illustrating distributions of program states or voltage levels of memory cells included in a semiconductor memory device.
Figure 3B:
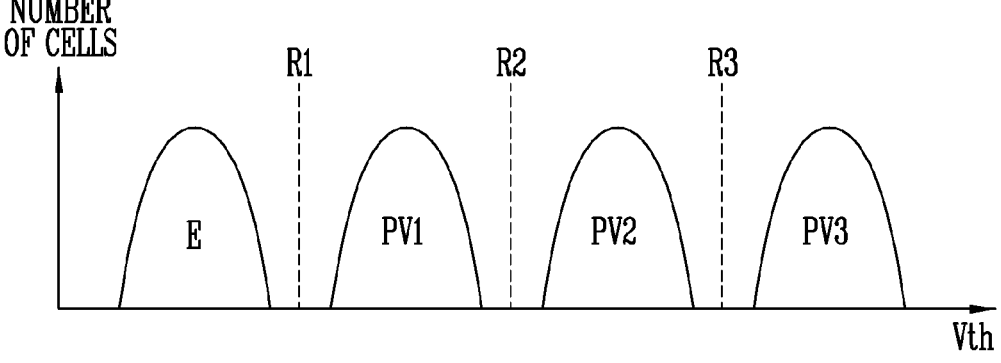
Figure 3C:
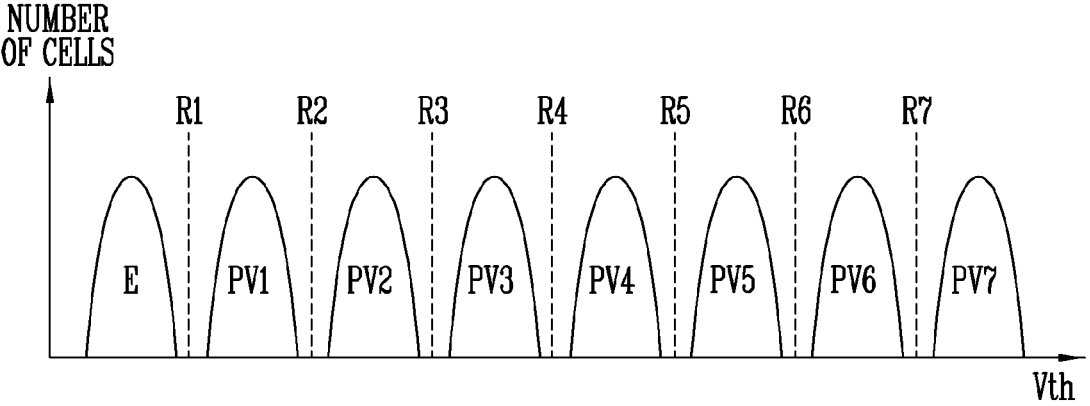

FIGS. 3A, 3B, and 3C are diagrams illustrating distributions of program states or voltage levels of memory cells included in a semiconductor memory device.

The distributions, illustrated in FIGS. 3A, 3B, and 3C, may be the distributions of the program states or voltage levels of the memory cells. In drawings, illustrated in FIGS. 3A, 3B, and 3C, an x axis denotes threshold voltages Vth of memory cells, and a y axis denotes the number of memory cells.

Referring to FIG. 3A, when the memory cells included in a memory cell array 110 are single-level cells (SLC), each of the memory cells may belong to any one of an erased state E and a program state PV. That is, in FIG. 3A, threshold voltage distributions of SLC-programmed memory cells are illustrated. In the present specification, the term "SLC-program" may refer to a program operation that is performed to store one bit in each memory cell.

Because the threshold voltage of a single-level cell may belong to one of two different states, each memory cell may store one bit. In this case, a plurality of memory cells that are coupled to one word line may form one physical page, and one physical page may store data corresponding to one page (one piece of page data). One piece of page data may be data including bits corresponding to respective memory cells included in one physical page. To perform a read operation on a physical page including a single-level cell, a read voltage R may be used.

Referring to FIG. 3B, when memory cells included in the memory cell array 110 are multi-level cells (MLC), each of the memory cells may belong to an erased state E or any one of first to third program states PV1 to PV3. That is, in FIG. 3B, threshold voltage distributions of MLC-programmed memory cells are illustrated. In the present specification, the term "MLC-program" may refer to a program operation that is performed to store two bits in each memory cell.

Since the threshold voltage of a multi-level cell may be included in one of four different states, each cell may program or store two different bits depending on a pre-defined coding scheme. A first bit, which is an upper bit of two bits, may be referred to as a Most Significant Bit (MSB), and a second bit, which is a lower bit of the two bits, may be referred to as a Least Significant Bit (LSB). In this case, a plurality of memory cells that are coupled to one word line may form one physical page, and one physical page may store data corresponding to two logical pages, that is, MSB page data and LSB page data. The MSB page data may include MSBs that are stored in respective memory cells included in a physical page. The LSB page data may include LSBs that are stored in respective memory cells included in a physical page. To perform a read operation on a physical page including a multi-level cell, first to third read voltages R1 to R3 may be used.

Referring to FIG. 3C, when the memory cells included in the memory cell array 110 are triple-level cells (TLC), each of the memory cells may belong to an erased state E or any one of first to seventh program states PV1 to PV7. That is, in FIG. 3C, threshold voltage distributions of TLC-programmed memory cells are illustrated. In the present speci-fication, the term "TLC-program" may refer to a program operation that is performed to store three bits in each memory cell.

Since the threshold voltage of a triple-level cell may be included in one of eight different states, each cell may program or store three different bits depending on a pre-defined coding scheme. A first bit, which is an upper bit of three bits, may be referred to an MSB, a second bit, which is a central bit of the three bits, may be referred to as a Central Significant Bit (CSB), and a third bit, which is a lower bit of the three bits, may be referred to as an LSB. In this case, a plurality of memory cells that are coupled to one word line may form one physical page, and one physical page may store data corresponding to three logical pages, that is, MSB page data, CSB page data, and LSB page data. The MSB page data may include MSBs that are stored in respective memory cells included in a physical page. The CSB page data may include CSBs that are stored in respec-tive memory cells included in a physical page. The LSB page data may include LSBs that are stored in respective memory cells included in a physical page. To perform a read operation on a physical page including a triple-level cell, first to seventh read voltages R1 to R7 may be used.

As illustrated in FIGS. 3A to 3C, the number of program states by which threshold voltages of memory cells are distinguished from each other may vary depending on the number of bits that are stored in each of the memory cells included in the memory cell array 110. Furthermore, read voltages to be used in the read operation may change depending on the number of bits that are stored in each memory cell. For example, the read voltage R, illustrated in FIG. 3A, may be different from the first to third read voltages R1 to R3, illustrated in FIG. 3B. This means that the read voltage that is used in a read operation on the SLC-programmed physical page may be different from the read voltage that is used in a read operation on the MLC-programmed physical page.

Further, the read voltage R, illustrated in FIG. 3A, may be different from the first to seventh read voltages R1 to R7, illustrated in FIG. 3C. This means that the read voltage that is used in a read operation on the SLC-programmed physical page may be different from the read voltage that is used in a read operation on the TLC-programmed physical page.

Meanwhile, each of the first to third read voltages R1 to R3, illustrated in FIG. 3B, may be different from the first to seventh read voltages R1 to R7, illustrated in FIG. 3C. This means that the read voltage that is used in a read operation on the MLC-programmed physical page may be different from the read voltage that is used in a read operation on the TLC-programmed physical page.

Figure 4:
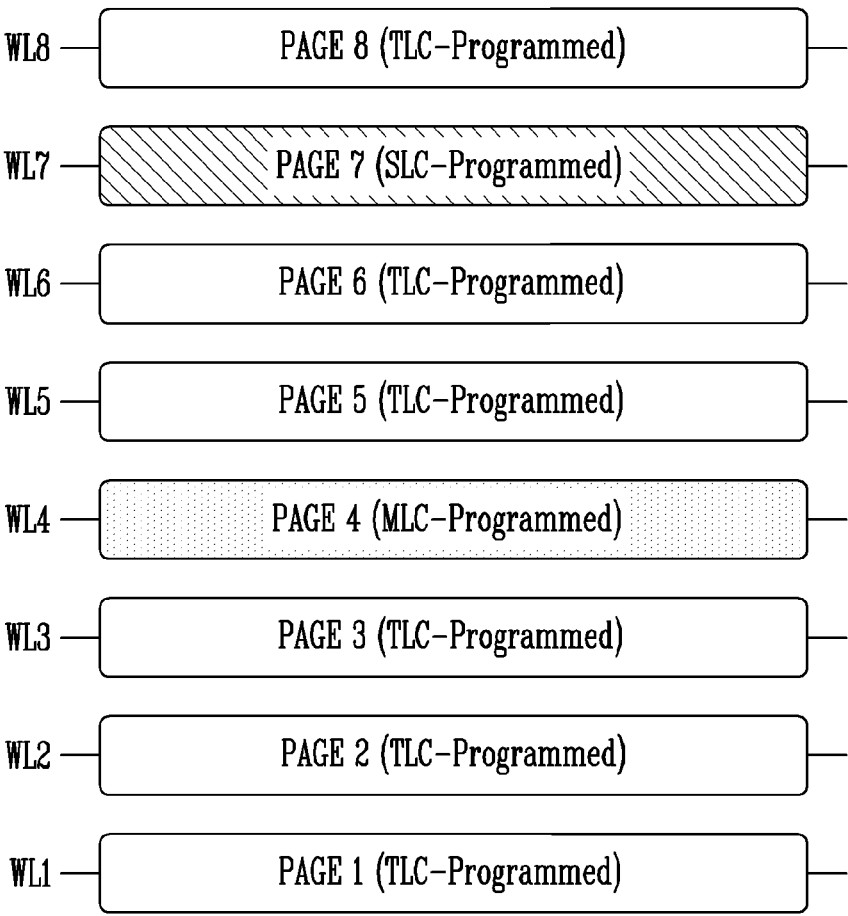
FIG. 4 is a diagram illustrating a memory block including pages that are programmed through different program schemes.

FIG. 4 is a diagram illustrating a memory block including pages that are programmed by using different program schemes. Referring to FIG. 4, eight physical pages included in the memory block are illustrated as an example. First to eighth physical pages may be coupled to first to eighth word lines WL1 to WL8, respectively. The physical pages, illus-trated in FIG. 4, may be programmed through different program schemes. In detail, the first to third physical pages, fifth and sixth physical pages, and the eighth physical page may be TLC-programmed. Meanwhile, the fourth physical page may be MLC-programmed, and the seventh physical page may be SLC-programmed.

As described above, a read voltage that is used in a read operation on the SLC-programmed physical page, read voltages that are used in a read operation on the MLC-programmed physical page, and read voltages that are used in a read operation on the TLC-programmed physical page may be different from each other. In this case, as illustrated in FIG. 4, when physical pages that are programmed through different schemes are successively read, the read voltages need to be repeatedly changed. This causes the read perfor-mance of the semiconductor memory device to deteriorate.

In accordance with an embodiment of the present disclo-sure, an MLC-program operation or an SLC-program opera-tion may be performed by using logic codes and verify voltages that are used in a TLC-program operation. Accord-ingly, the same read voltage may be used even when physical pages that are programmed through different pro-gram schemes are successively read.

Although the example in which the pages that are pro-grammed through different program schemes are included in one memory block is illustrated in FIG. 4, the present disclosure is not limited thereto. For example, the present disclosure may also be applied to the case in which pages that are programmed through different schemes are included in different memory blocks. In detail, physical pages included in a first memory block, among the plurality of memory blocks included in the semiconductor memory device, may be SLC-programmed, physical pages included in a second memory block may be MLC-programmed, and physical pages included in a third memory block may be TLC-programmed.

FIG. 5 is a flowchart illustrating a method of operating a semiconductor memory device according to an embodiment of the present disclosure.

The method of operating the semiconductor memory device, according to an embodiment of the present disclo-sure, may include step S100 of programming memory cells included in a first physical page so that each of the memory cells stores N bits, and step S200 of programming memory cells included in a second physical page by using logic codes and verify voltages that are used in the programming of the first physical page so that each of the memory cells stores N−1 bits.

In accordance with an embodiment of the present disclosure, N indicated in FIG. 5 may be a natural number greater than or equal to 2. However, for convenience of description, the case in which N is 3 will be described below. When N is 3, the memory cells included in the first physical page may be programmed such that each memory cell stores three bits at step S100. That is, at step S100, the memory cells included in the first physical page may be TLC-programmed.

At step S200, the memory cells included in the second physical page may be programmed by using the logic codes and the verify voltages that are used in the TLC-programming of the first physical page so that each memory cell stores two bits. That is, at step S200, the memory cells included in the second physical page may be MLC-programmed.

In accordance with an embodiment of the present disclosure, the MLC-program operation on the second physical page may be performed, using some of verify voltages that are used in the TLC-program operation on the first physical page at step S100, at step S200. Accordingly, when data in the MLC-programmed second physical page is read, a read voltage that is used in the read operation on the TLC-programmed page may be used. Therefore, physical pages that are programmed through different schemes may be successively read without changing the read voltage. As a result, the read performance of the semiconductor memory device may be improved.

Figure 7:
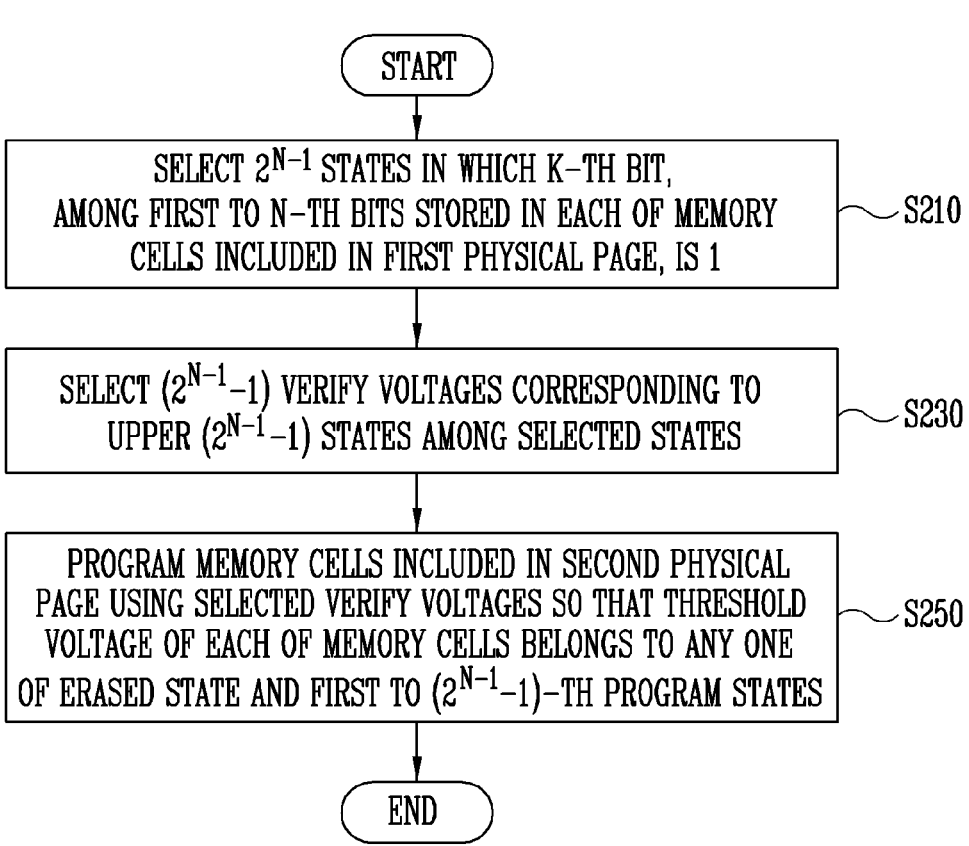
FIG. 7 is a flowchart illustrating an embodiment of step S200 of FIG. 5.
Figure 8A:
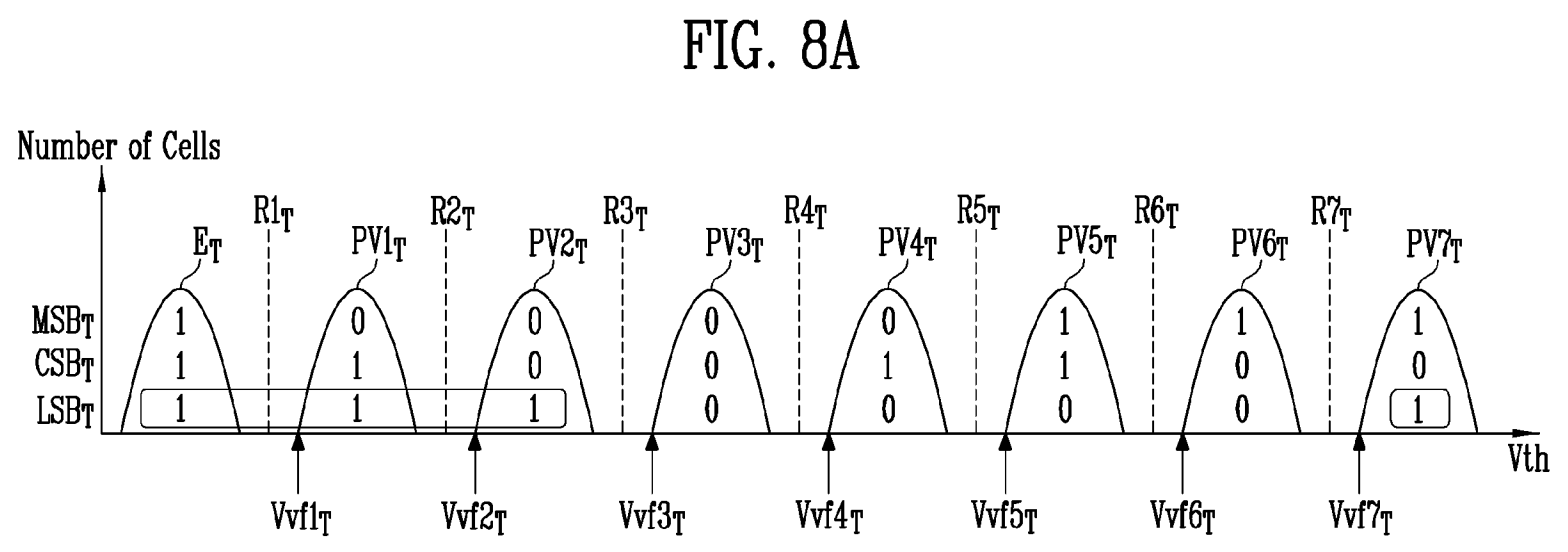
Figure 8B:
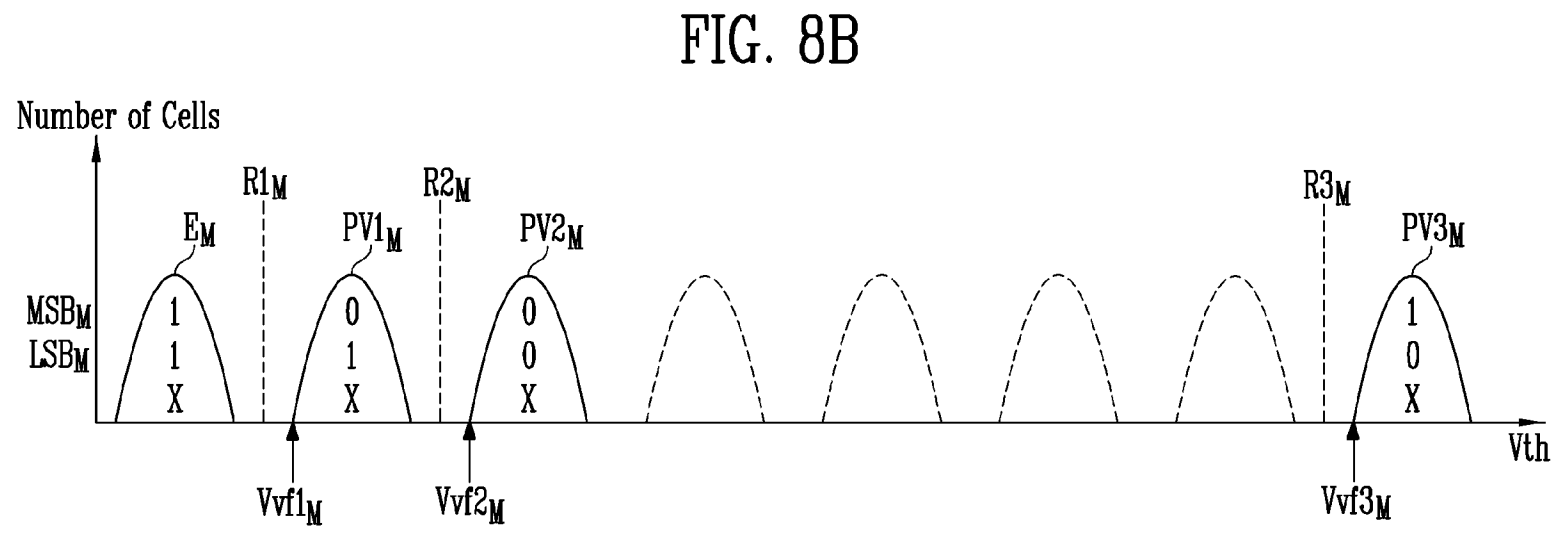

FIG. 6 is a flowchart illustrating an embodiment of step S100 of FIG. 5. FIG. 7 is a flowchart illustrating an embodiment of step S200 of FIG. 5. FIG. 8A is a diagram illustrating steps S210 and S230 of FIG. 7. FIG. 8B is a diagram illustrating step S250 of FIG. 7. Hereinafter, embodiments of steps S100 and S200 will be described in detail with reference to FIGS. 6, 7, 8A, and 8B together.

Referring to FIG. 6, step S100 of programming the memory cells included in the first physical page so that each memory cell stores N bits in FIG. 5 may include step S110 of programming the memory cells included in the first physical page by using first to $(2^N-1)$-th verify voltages so that the threshold voltage of each of the memory cells belongs to any one of an erased state and first to $(2^N-1)$-th program states.

As described above, for convenience of description, the case in which N is 3 will be described below. Referring to FIG. 8A, threshold voltage distributions of memory cells based on the TLC-program operation are illustrated. When N is 3, the memory cells included in the first physical page may be programmed such that each memory cell stores three bits at step S100. That is, the step of TLC-programming the memory cells included in the first physical page may include the step of programming the memory cells in the first physical page by using first to seventh verify voltages $Vvf1_T$ to $Vvf7_T$ so that the threshold voltage of each of the memory cells belongs to any one of the erased state $F_T$ and the first to seventh program states $PV1_T$ to $PV7_T$.

When N is 3, each of the erased state $E_T$ and the first to seventh program states $PV1_T$ to $PV7_T$ may have logic code corresponding thereto. In detail, the logic code corresponding to each of the erased state $E_T$ and the first to seventh program states $PV1_T$ to PV7 may be composed of 3 bits. A first bit is $MSB_T$, a second bit is $CSB_T$, and a third bit may be $LSB_T$. In accordance with the embodiment illustrated in FIG. 8A, logic code corresponding to the erased state $E_T$ may be "1 1 1", logic code corresponding to the first program state $PV1_T$ may be "0 1 1", logic code corresponding to the second program state $PV2_T$ may be "0 0 1", logic code corresponding to the third program state $PV3_T$ may be "0 0 0", logic code corresponding to the fourth program state $PV4_T$ may be "0 1 0", logic code corresponding to the fifth program state $PV5_T$ may be "1 1 0", logic code corresponding to the sixth program state PV6 may be "1 0 0", and logic code corresponding to the seventh program state $PV7_T$ may be "1 0 1". However, this is only an example, and logic codes respectively corresponding to the erased state $E_T$ and the first to seventh program states $PV1_T$ to PV7 may be set by using various other schemes.

In an embodiment, step S110 may be performed by using an incremental step pulse programming (ISPP) method. In this case, step S110 may include a plurality of program loops. Each program loop may include a program voltage apply step and a verify step. At the program voltage apply step, threshold voltages of program enable cells, among the memory cells included in the first physical page, may be increased by applying a program voltage to a word line that is coupled to the first physical page. Meanwhile, at the verify step, whether programming of each of memory cells to be programmed to any one of the first to seventh program states $PV1_T$ to $PV7_T$ has been completed may be determined by using at least one of the first to seventh verify voltages $Vvf1_T$ to $Vvf7_T$. When the ISPP method is used, the program loops may be repeatedly performed until each selected memory cell is successfully programmed to a target program state or until the number of program operations reaches the preset maximum number of program operations.

Meanwhile, referring to FIG. 7, step S200 of programming the memory cells included in the second physical page by using logic codes and verify voltages that are used in the programming of the first physical page so that each of the memory cells stores N−1 bits, as illustrated in FIG. 5, may include step S210 of selecting $2^{N-1}$ states in which a K-th bit, among first to N-th bits that are stored in each of the memory cells included in the first physical page, is 1, step S230 of selecting $(2^{N-1}-1)$ verify voltages corresponding to upper $(2^{N-1}-1)$ states, among the selected states, and step S250 of programming memory cells included in the second physical page by using the selected verify voltages so that the threshold voltage of each of the memory cells belongs to any one of the erased state and the first to $(2^{N-1}-1)$-th program states.

When N is 3, the memory cells included in the second physical page may be programmed such that each memory cell stores two bits at step S200. In this case, the memory cells included in the second physical page are programmed by using the logic codes and the verify voltages that are used in programming of the first physical page.

In detail, at step S210, four states in which a K-th bit, among first to third bits, that is, $MSB_T$, $CSB_T$, and $LSB_T$ that are stored in each memory cell included in the first physical page, is 1 may be selected. For exemplification, the case in which K is 3 may be assumed. In this case, at step S210, four states in which the third bit, that is, $LSB_T$, is 1 may be selected. However, this is only an example, and K may be 1 or 2. That is, K may be a natural number that is greater than or equal to 1 and less than or equal to N. In an example, when K is 1, four states in which $MSB_T$ is 1 may be selected at step S210. In an example, when K is 2, four states in which $CSB_T$ is 1 may be selected at step S210.

Referring to FIG. 8A, the states in which $LSB_T$ is 1 may be the erased state $E_T$, the first program state $PV1_T$, the second program state $PV2_T$, and the seventh program state $PV7_T$. That is, at step S210, the four states in which $LSB_T$ is 1, that is, $E_T$, $PV1_T$, $PV2_T$, and $PV7_T$, may be selected from among the states $E_T$ and $PV1_T$ to $PV7_T$, formed by a TLC-program operation.

At step S230, three verify voltages corresponding to upper three states, among the selected four states $E_T$, $PV1_T$, $PV2_T$, and $PV7_T$, may be selected. The erased state $E_T$, which is the lowest state among the selected four states $E_T$, $PV1_T$, $PV2_T$, and $PV7_T$, may correspond to the erased state $E_M$ of MLC programming. Therefore, at step S230, verify voltages $Vvf1_T$, $Vvf2_T$, and $Vvf7_T$ corresponding to upper three states $PV1_T$, $PV2_T$, and $PV7_T$ may be selected.

At step S250, memory cells in the second physical page may be programmed by using the verify voltages $Vvf1_T$, $Vvf2_T$, and $Vvf7_T$ that are selected at step S230 such that the threshold voltage of each of the memory cells belongs to any one of the erased state and the first to third program states.

In FIG. 8B, threshold voltage distributions of memory cells included in the second physical page depending on the MLC-program operation are illustrated. Referring to FIG. 8B, memory cells corresponding to a first program state $PV1_M$ may be programmed by using a first verify voltage $Vvf1_M$, memory cells corresponding to a second program state $PV2_M$ may be programmed by using a second verify voltage $Vvf2_M$, and memory cells corresponding to a third program state $PV3_M$ may be programmed by using a third verify voltage $Vvf3_M$.

Referring to FIGS. 8A and 8B together, it can be seen that the first to third verify voltages $Vvf1_M$, $Vvf2_M$, and $Vvf3_M$, that are used in the MLC-program operation may be substantially identical to the verify voltages $Vvf1_T$, $Vvf2_T$, and $Vvf7_T$, respectively, selected at step S230. Meanwhile, in threshold voltage distributions that are formed by the MLC-program operation, each of the erased state $E_M$ and the first to third program states $PV1_M$ to $PV3_M$ may have logic codes corresponding thereto. In detail, the logic code corresponding to each of the erased state $E_M$ and the first to third program states $PV1_M$ to $PV3_M$ may be composed of 2 bits. A first bit may be $MSB_M$, and a second bit may be $LSB_M$. In an embodiment illustrated in FIG. 8B, the logic code corresponding to the erased state $E_M$ may be "1 1", the logic code corresponding to the first program state $PV1_M$ may be "0 1", the logic code corresponding to the second program state $PV2_M$ may be "0 0", and the logic code corresponding to the third program state $PV3_M$ may be "1 0".

Referring to FIGS. 8A and 8B, $MSB_M$ of the logic code corresponding to the erased state $E_M$ of the MLC-program operation may be identical to $MSB_T$ of the logic code corresponding to the erased state $E_T$ of the TLC-program operation. Further, $LSB_M$ of the logic code corresponding to the erased state $E_M$ of the MLC-program operation may be identical to $CSB_T$ of the logic code corresponding to the erased state $E_T$ of the TLC-program operation. At step S210, because the states in which $LSB_T$ is 1 are selected from among the states of the TLC-program operation, $MSB_M$ and $LSB_M$, which is to be used in the MLC-program operation, may be configured by using $MSB_T$ and $CSB_T$ that is used in the TLC-program operation.

Similarly, $MSB_M$ of the logic code corresponding to the first program state $PV1_M$ of the MLC-program operation may be identical to $MSB_T$ of the logic code corresponding to the first program state $PV1_T$ of the TLC-program operation. Further, $LSB_M$ of the logic code corresponding to the first program state $PV1_M$ of the MLC-program operation may be identical to $CSB_T$ of the logic code corresponding to the first program state $PV1_T$ of the TLC-program operation.

Meanwhile, $MSB_M$ of the logic code corresponding to the second program state $PV2_M$ of the MLC-program operation may be identical to $MSB_T$ of the logic code corresponding to the second program state $PV2_T$ of the TLC-program operation. Further, $LSB_M$ of the logic code corresponding to the second program state $PV2_M$ of the MLC-program operation may be identical to $CSB_T$ of the logic code corresponding to the second program state PV21 of the TLC-program operation.

Finally, $MSB_M$ of the logic code corresponding to the third program state $PV3_M$ of the MLC-program operation may be identical to $MSB_T$ of the logic code corresponding to the seventh program state $PV7_T$ of the TLC-program operation. Further, $LSB_M$ of the logic code corresponding to the third program state $PV3_M$ of the MLC-program operation may be identical to $CSB_T$ of the logic code corresponding to the seventh program state $PV7_T$ of the TLC-program operation.

By the means of the above-described scheme, respective states of the MLC-program operation and logic codes corresponding thereto may be configured, and the MLC-program operation may be performed by using the verify voltages, selected at step S230, at step S250. In this case, a read operation may be performed on the second physical page by using first to third read voltages $R1_M$ to $R3_M$. Referring to FIGS. 8A and 8B together, the first read voltage $R1_M$ that is used in the read operation on the second physical page may be substantially identical to the first read voltage $R1_T$ that is used in the read operation on the first physical page, the second read voltage $R2_M$ that is used in the read operation on the second physical page may be substantially identical to the second read voltage $R2_T$ that is used in the read operation on the first physical page, and the third read voltage $R3_M$ that is used in the read operation on the second physical page may be substantially identical to the seventh read voltage $R7_T$ that is used in the read operation on the first physical page.

Accordingly, the read operation may be performed on the MLC-programmed second physical page by using at least one, but not all, of the read voltages that are used in the read operation on the TLC-programmed first physical page (i.e., read voltages $R1_T$, $R2_T$, and $R7_T$, among the read voltages $R1_T$ to $R7_T$ that are used in the read operation on the TLC-programmed first physical page). Accordingly, the read operation on the TLC-programmed first physical page and the read operation on the MLC-programmed second physical page may be successively performed without changing read voltage values.

Similar to step S110 of FIG. 6, step S250 of FIG. 7 may also be performed by using an incremental step pulse programming (ISPP) method.

Figure 10A:
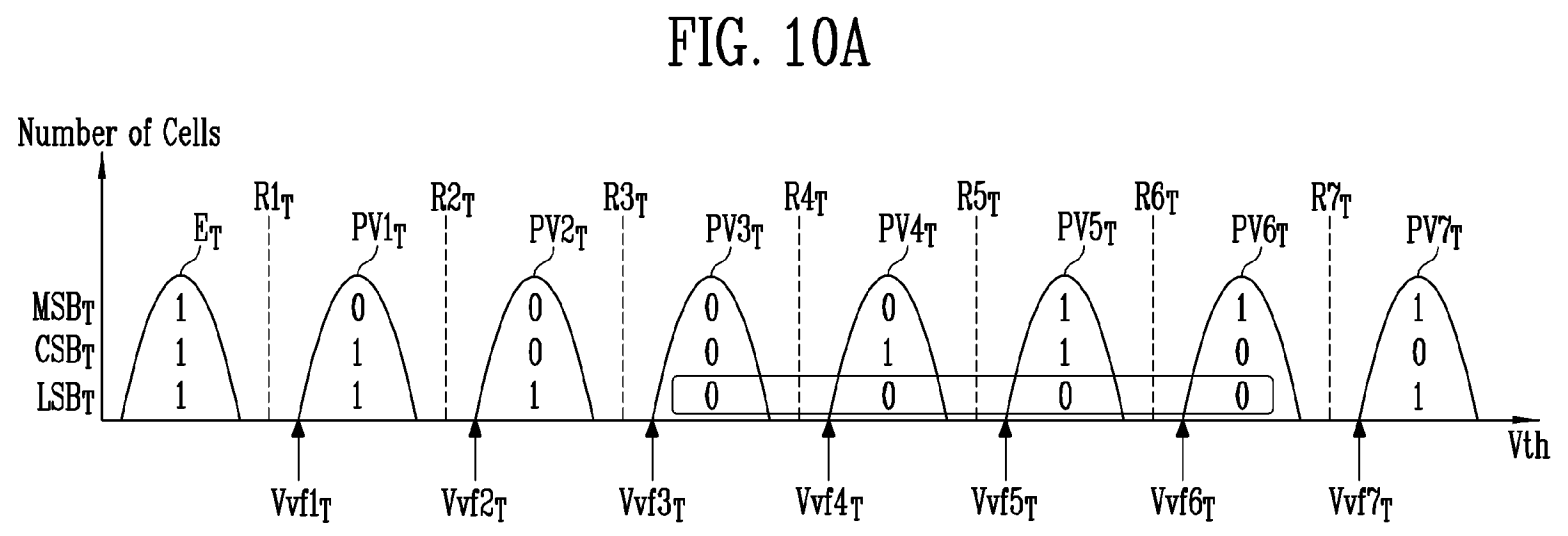
Figure 10B:
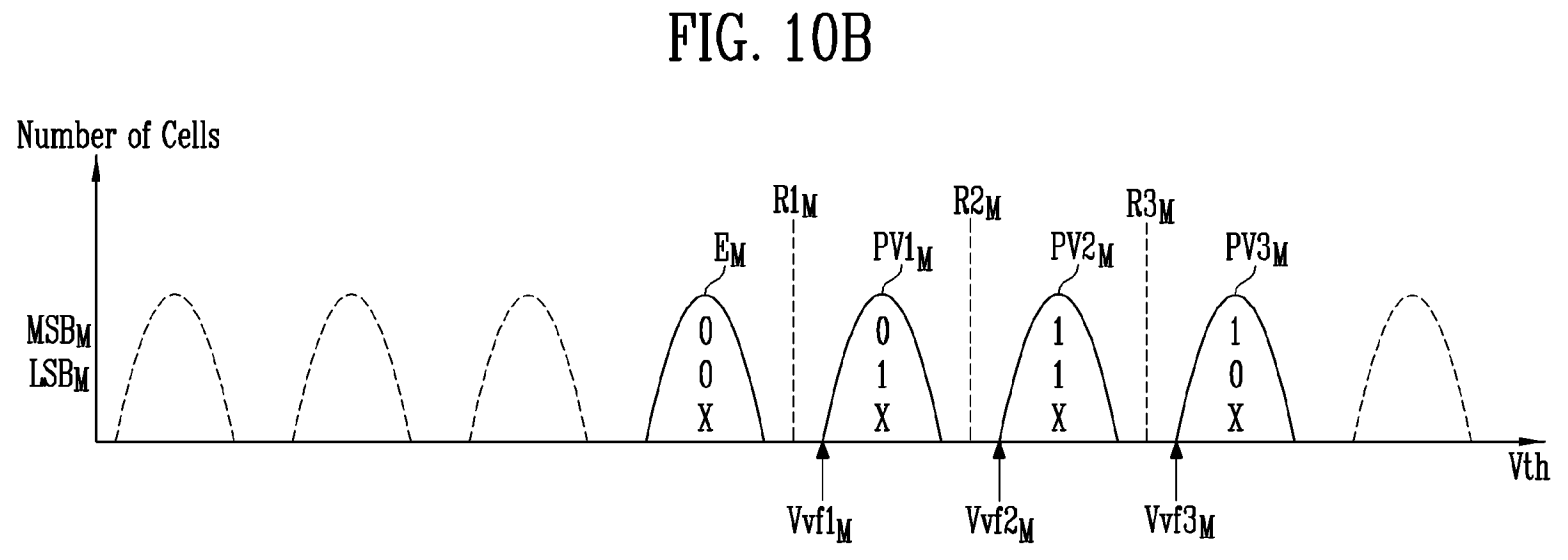
Figure 10C:
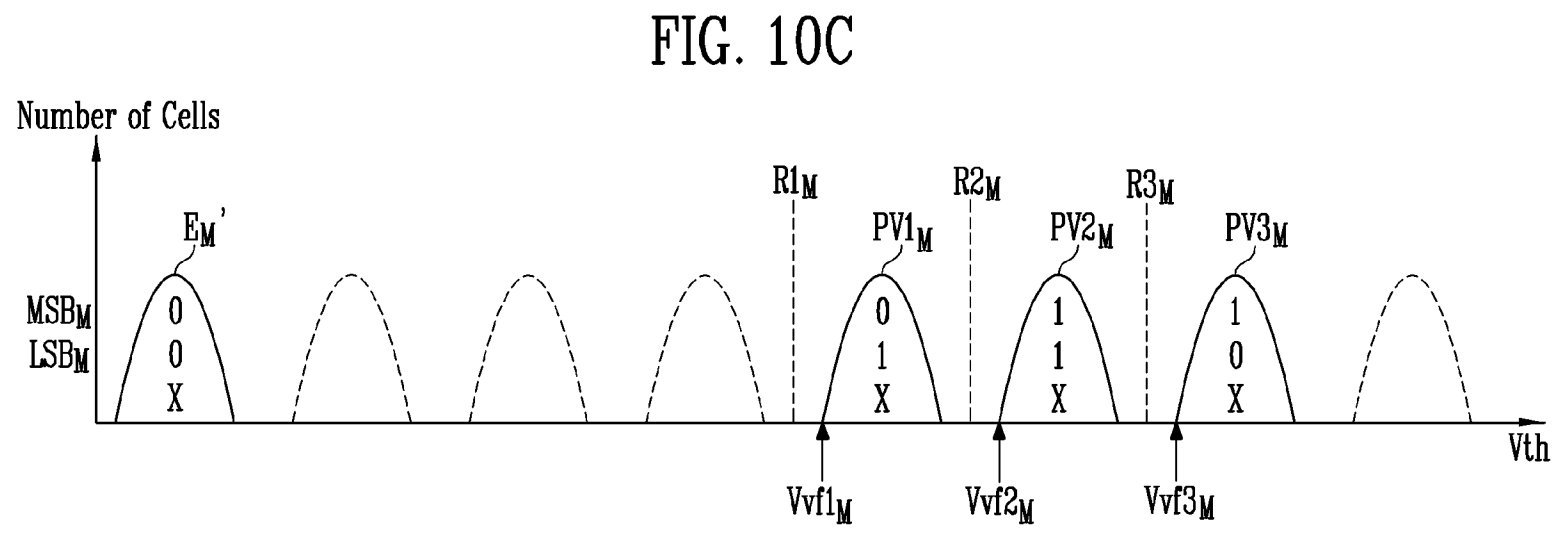

FIG. 9 is a flowchart illustrating an embodiment of step S200 of FIG. 5. FIG. 10A is a diagram illustrating steps S220 and S230 of FIG. 9. FIGS. 10B and 10C are diagrams illustrating step S250 of FIG. 9. Hereinafter, an embodiment of step S200 will be described with reference to FIGS. 9, 10A, 10B, and 10C together.

Referring to FIG. 9, step 200 of FIG. 5 may include step S220 of selecting $2^{N-1}$ states in which a K-th bit, among first to N-th bits that are stored in each of the memory cells included in the first physical page, is 0, step S230 of selecting $(2^{N-1}-1)$ verify voltages corresponding to upper $(2^{N-1}-1)$ states, among the selected states, and step S250 of programming memory cells included in the second physical page by using the selected verify voltages so that the threshold voltage of each of the memory cells belongs to any one of the erased state and the first to $(2^{N-1}-1)$-th program states.

Referring to FIGS. 7 and 9 together, steps S230 and S250, illustrated in FIG. 9, are substantially identical to steps S230 and S250, illustrated in FIG. 7. Therefore, repeated descriptions of steps S230 and S250 will be omitted.

When N is 3, four states in which a K-th bit, among first to third bits, that is, $MSB_T$, $CSB_T$, and $LSB_T$, stored in each memory cell included in the first physical page, is 0 may be selected at step S220. Unlike step S210 of FIG. 7, which illustrates states in which the K-th bit is 1 are selected, step S220 of FIG. 9 may select the states in which the K-th bit is 0. For example, the case in which K is 3 may be assumed. In this case, at step S220, four states in which a third bit, that is, $LSB_T$, is 0 may be selected. However, this is only an example, and K may be 1 or 2. That is, K may be a natural number that is greater than or equal to 1 and less than or equal to N. In an example, when K is 1, four states in which $MSB_T$ is 0 may be selected at step S220. In an example, when K is 2, four states in which $CSB_T$ is 0 may be selected at step S220.

Referring to FIG. 10A, states in which $LSB_T$ is 0 may be a third program state $PV3_T$, a fourth program state $PV4_T$, a fifth program state $PV5_T$, and a sixth program state $PV6_T$. That is, at step S220, four states in which $LSB_T$ is 0, that is, $PV3_T$, $PV4_T$, $PV5_T$, and $PV6_T$, are selected from among the states $E_T$ and $PV1_T$ to $PV7_T$ formed by the TLC-program operation.

At step S230, three verify voltages corresponding to upper three states, among the selected four states $PV3_T$, $PV4_T$, $PV5_T$, and $PV6_T$, may be selected. The program state $PV3_T$, which is the lowest state among the selected four states $PV3_T$, $PV4_T$, $PV5_T$, and $PV6_T$, may correspond to the erased state $E_M$ in the MLC-program operation. Therefore, at step S230, verify voltages $Vvf4_T$, $Vvf5_T$, and $Vvf6_T$ corresponding to the upper three states $PV4_T$, $PV5_T$, and $PV6_T$ may be selected.

At step S250, memory cells in the second physical page may be programmed by using the verify voltages $Vvf4_T$, $Vvf5_T$, and $Vvf6_T$ that are selected at step S230 such that the threshold voltage of each of the memory cells belongs to any one of the erased state and the first to third program states.

In FIG. 10B, threshold voltage distributions of memory cells included in the second physical page depending on the MLC-program operation are illustrated. Referring to FIG. 10B, memory cells corresponding to a first program state $PV1_M$ may be programmed by using a first verify voltage $Vvf1_M$, memory cells corresponding to a second program state $PV2_M$ may be programmed by using a second verify voltage $Vvf2_M$, and memory cells corresponding to a third program state $PV3_M$ may be programmed by using a third verify voltage $Vvf3_M$.

Referring to FIGS. 10A and 10B together, it can be seen that the first to third verify voltages $Vvf1_M$, $Vvf2_M$, and $Vvf3_M$, that are used in the MLC-program operation, may be substantially identical to the verify voltages $Vvf4_T$, $Vvf5_T$, and $Vvf6_T$, respectively, selected at step S230.

Meanwhile, in FIG. 10B, a threshold voltage distribution corresponding to the erased state $E_M$ is illustrated as being substantially identical to a threshold voltage distribution corresponding to the third program state $PV3_T$, illustrated in FIG. 10A. However, in the MLC-program operation, threshold voltages of memory cells corresponding to the erased state $E_M$ might not increase. Therefore, after the MLC-program operation is completed, threshold voltage distributions of memory cells included in the second physical page may actually be formed, as illustrated in FIG. 10C. Referring to FIG. 10C, a threshold voltage distribution corresponding to an erased state $E_M$ after the MLC-program operation is completed may be substantially identical to that of the erased state $E_T$, illustrated in FIG. 10A.

Meanwhile, in threshold voltage distributions that are formed by the MLC-program operation, each of the erased state $E_M$ and the first to third program states $PV1_M$ to $PV3_M$ may have logic codes corresponding thereto. Referring to FIGS. 10A and 10B together, $MSB_M$ of the logic code corresponding to the erased state $E_M'$ of the MLC-program operation may be identical to $MSB_T$ of the logic code corresponding to the third program state $PV3_T$ of the TLC-program operation. Further, $LSB_M$ of the logic code corresponding to the erased state $E_M'$ of the MLC-program operation may be identical to $CSB_T$ of the logic code corresponding to the third program state $PV3_T$ of the TLC-program operation. At step S220, because the states in which $LSB_T$ is 0 are selected from among the states of the TLC-program operation, $MSB_M$ and $LSB_M$ to be used in the MLC-program operation may be configured by using $MSB_T$ and $CSB_T$ used in the TLC-program operation.

Similarly, $MSB_M$ of the logic code corresponding to the first program state $PV1_M$ of the MLC-program operation may be identical to $MSB_T$ of the logic code corresponding to the fourth program state $PV4_T$ of the TLC-program operation. Further, $LSB_M$ of the logic code corresponding to the first program state $PV1_M$ of the MLC-program operation may be identical to $CSB_T$ of the logic code corresponding to the fourth program state $PV4_T$ of the TLC-program operation.

Meanwhile, $MSB_M$ of the logic code corresponding to the second program state $PV2_M$ of the MLC-program operation may be identical to $MSB_T$ of the logic code corresponding to the fifth program state $PV5_T$ of the TLC-program operation. Further, LSB of the logic code corresponding to the second program state $PV2_M$ of the MLC-program operation may be identical to $CSB_T$ of the logic code corresponding to the fifth program state $PV5_T$ of the TLC-program operation.

Finally, $MSB_M$ of the logic code corresponding to the third program state PV3 of the MLC-program operation may be identical to $MSB_T$ of the logic code corresponding to the sixth program state $PV6_T$ of the TLC-program operation. Further, $LSB_M$ of the logic code corresponding to the third program state $PV3_M$ of the MLC-program operation may be identical to $CSB_T$ of the logic code corresponding to the sixth program state $PV6_T$ of the TLC-program operation.

By means of the above-described scheme, respective states of the MLC-program operation and logic codes corresponding thereto may be configured, and the MLC-program operation may be performed by using the verify voltages, selected at step S230, at step S250. In this case, a read operation may be performed on the second physical page by using first to third read voltages $R1_M$ to $R3_M$. Referring to FIGS. 10A and 10C together, the first read voltage $R1_M$ that is used in the read operation on the second physical page may be substantially identical to the fourth read voltage $R4_T$ that is used in the read operation on the first physical page, the second read voltage $R2_M$ that is used in the read operation on the second physical page may be substantially identical to the fifth read voltage $R5_T$ that is used in the read operation on the first physical page, and the third read voltage $R3_M$ that is used in the read operation on the second physical page may be substantially identical to the sixth read voltage $R6_T$ that is used in the read operation on the first physical page.

Accordingly, the read operation may be performed on the MLC-programmed second physical page by using some of the read voltages $R4_T$, $R5_T$, and $R6_T$, among the read voltages $R1_T$ to $R7_T$ that are used in the read operation on the TLC-programmed first physical page. Accordingly, the read operation on the TLC-programmed first physical page and the read operation on the MLC-programmed second physical page may be successively performed without changing read voltage values.

FIG. 11 is a flowchart illustrating a method of operating a semiconductor memory device according to an embodiment of the present disclosure.

Referring to FIG. 11, the method of operating the semiconductor memory device according to an embodiment of the present disclosure may include step S300 of programming memory cells included in a first physical page so that each of the memory cells stores N bits, and step S400 of programming memory cells included in a second physical page by using logic codes and verify voltages that are used in the programming of the first physical page so that each of the memory cells stores (N−2) bits.

Step S300 of FIG. 11 may be substantially identical to step S100 of FIG. 5. That is, step S300 of FIG. 11 may include step S110 of FIG. 6. Therefore, repeated descriptions of step S300 will be omitted. Meanwhile, for convenience of description, the case in which N is 3 will be described below. When N is 3, the memory cells included in the first physical page may be TLC-programmed such that each memory cell stores three bits at step S300.

At step S400, the memory cells included in the second physical page may be SLC-programmed by using the logic codes and the verify voltages that are used in the TLC-programming of the first physical page so that each memory cell stores one bit.

That is, in accordance with an embodiment of the present disclosure, the SLC-program operation on the second physical page may be performed at step S400 by using some of verify voltages that are used in the TLC-program operation on the first physical page at step S300. Accordingly, when data in the SLC-programmed second physical page is read, a read voltage that is used in the read operation on the TLC-programmed page may be used. Therefore, physical pages that are programmed through different schemes may be successively read without changing the read voltage. As a result, the read performance of the semiconductor memory device may be improved.

Figure 13A:
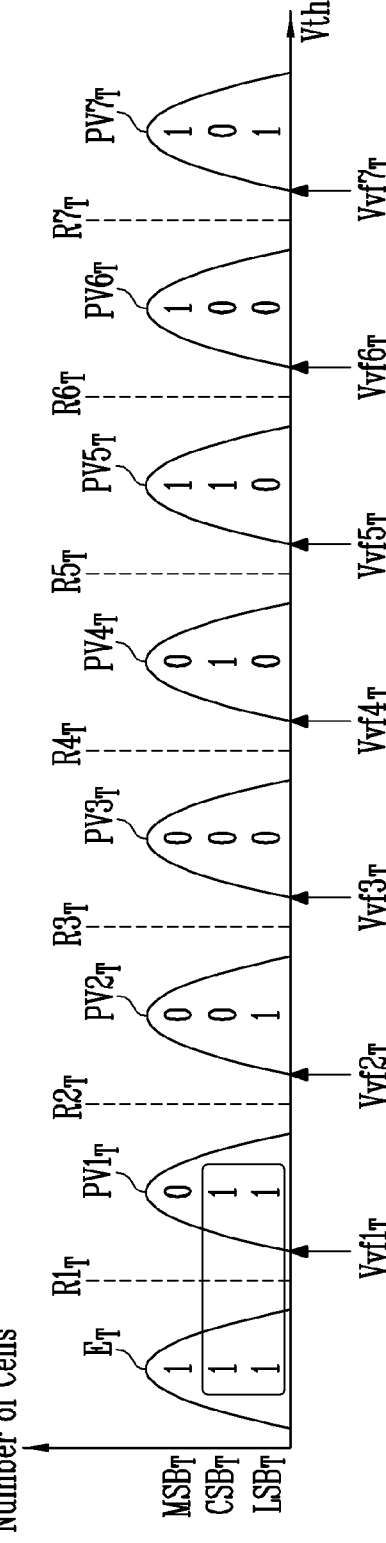
FIG. 13A is a diagram illustrating examples of steps 3410 and S430 of FIG. 12.
Figure 13B:
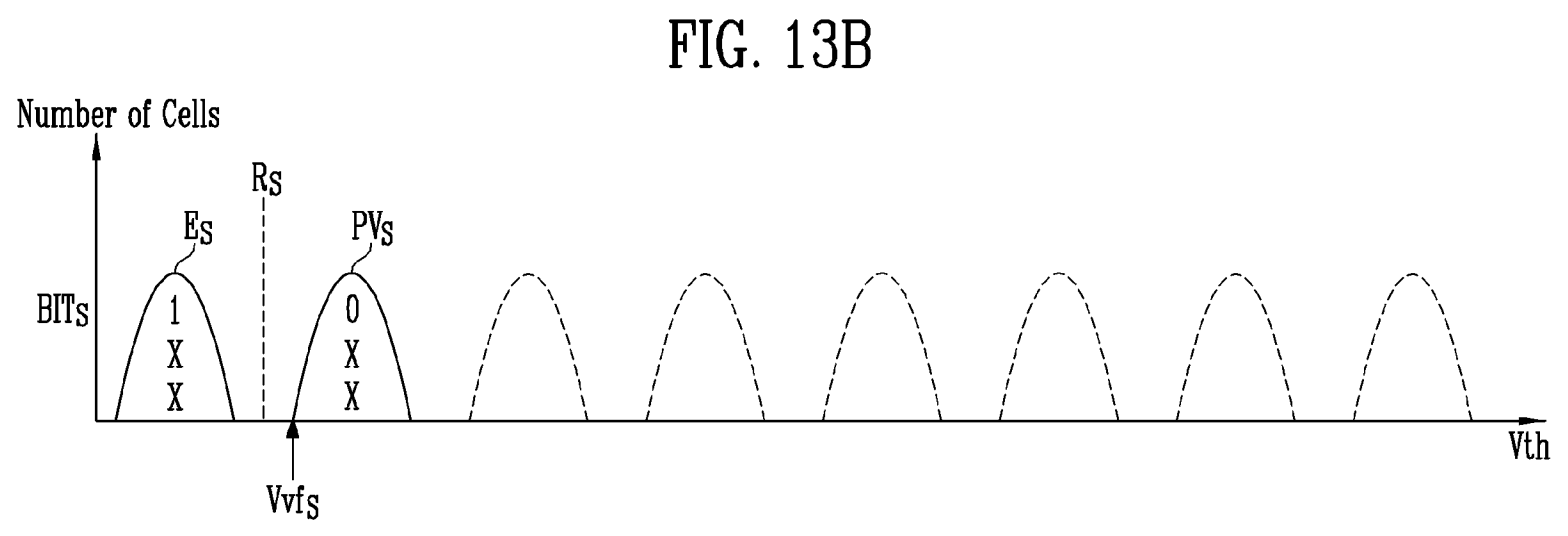

FIG. 12 is a flowchart illustrating an embodiment of step S400 of FIG. 11. FIG. 13A is a diagram illustrating examples of steps S410 and S430 of FIG. 12. FIG. 13B is a diagram illustrating an example of step S450 of FIG. 12. Hereinafter, examples of steps S300 and 3400 will be described in detail with reference to FIGS. 11, 12, 13A, and 13B together.

As described above, for convenience of description, the case in which N is 3 will be described below. At step S300 in FIG. 11, memory cells included in the first physical page may be TLC-programmed such that each of the memory cells stores N bits. Referring to FIG. 13A, threshold voltage distributions of memory cells based on the TLC-program operation are illustrated. When N is 3, step S300 of TLC-programming the memory cells included in the first physical page may include the step of programming the memory cells in the first physical page by using first to seventh verify voltages $Vvf1_T$ to $Vvf7_T$ so that the threshold voltage of each of the memory cells belongs to any one of the erased state $E_T$ and the first to seventh program states $PV1_T$ to $PV7_T$. Meanwhile, as described above with reference to FIG. 8A, each of the erased state $E_T$ and the first to seventh program states $PV1_T$ to $PV7_T$ may have logic code corresponding thereto.

Meanwhile, referring to FIG. 12, step S400 of programming memory cells included in the second physical page by using the logic codes and the verify voltages that are used in the programming of the first physical page so that each of the memory cells stores (N−2) bits, in FIG. 11, may include step S410 of selecting $2^{N-2}$ states in which a K-th bit, among first to N-th bits that are stored in each of the memory cells included in the first physical page, is 1, step S430 of selecting $(2^{N-2}-1)$ verify voltages corresponding to upper $(2^{N-2}-1)$ states, among the selected states, and step S450 of programming memory cells included in the second physical page by using the selected verify voltages so that the threshold voltage of each of the memory cells belongs to any one of the erased state and the first to $(2^{N-2}-1)$-th program states.

When N is 3, the memory cells included in the second physical page may be programmed such that each memory cell stores one bit at step S400. In this case, the memory cells included in the second physical page may be programmed by using the logic codes and the verify voltages that are used in programming of the first physical page.

In detail, at step S410, four states in which an H-th bit and K-th bit, among first to third bits, that is, $MSB_T$, $CSB_T$, and $LSB_T$ that are stored in each memory cell included in the first physical page, are 1 may be selected.

H may be a natural number that is randomly selected from among 1 to 3, and K may be a natural number that is randomly selected from among the same numbers 1 to 3, except for the value that is selected as H among 1 to 3. For example, when H is 1, K may be 2 or 3. Also, when H is 2, K may be 1 or 3. Finally, when H is 3, K may be 1 or 2. For example, hereinafter, the case in which H is 2 and K is 3 may be assumed. In this case, at step S410, two states in which each of $CSB_T$ and $LSB_T$ is 1 may be selected.

Referring to FIG. 13A, states in which $CSB_T$ and $LSB_T$ are 1 may be an erased state $E_T$ and a first program state $PV1_T$. That is, at step S410, two states $E_T$ and $PV1_T$ in which $CSB_T$ and $LSB_T$ are 1 may be selected from among the states $E_T$ and $PV1_T$ to $PV7_T$ that are formed by the TLC-program operation.

At step S430, a verify voltage corresponding to an upper one state of the selected two states $E_T$ and $PV1_T$ may be selected. The erased state $E_T$, which is the lowest state of the selected two states $E_T$ and $PV1_T$, may correspond to the erased state $E_M$ in the MLC-program operation. Therefore, at step S430, a verify voltage $Vvf1_T$ corresponding to the upper state $PV1_T$ may be selected.

At step S450, the memory cells included in the second physical page may be programmed by using the verify voltage $Vvf1_T$ selected at step S430 so that the threshold voltage of each of the memory cells belongs to any one of the erased state and the program states.

In FIG. 13B, threshold voltage distributions of memory cells included in the second physical page depending on the SLC-program operation are illustrated. Referring to FIG. 13B, memory cells corresponding to a program state $PV_S$ may be programmed by using a verify voltage $Vvf_S$.

Referring to FIGS. 13A and 13B together, it can be seen that the verify voltage $Vvf_S$ that are used in the SLC-program operation may be substantially identical to the verify voltage $Vvf1_T$ that is selected at step S430. Meanwhile, in threshold voltage distributions that are formed by the SLC-program operation, each of the erased state $E_S$ and the program state $PV_S$ may have logic codes corresponding thereto. More specifically, the logic code corresponding to each of the erased state $E_S$ and the program state $PV_S$ may be implemented as one bit $BIT_S$. In an embodiment illustrated in FIG. 13B, the bit $BIT_S$ corresponding to the erased state $E_S$ may be "1", and the bit $BIT_S$ corresponding to the program state $PV_S$ may be "0".

Referring to FIGS. 13A and 13B together, the bit $BIT_S$ corresponding to the erased state $E_S$ of the SLC-program operation may be identical to $MSB_T$ of the logic code corresponding to the erased state $E_T$ of the TLC-program operation. At step S410, because states in which $CSB_T$ and $LSB_T$ are 1 are selected from among the states of the TLC-program operation, the bit $BIT_S$ that is used in the SLC-program operation may be configured by using $MSB_T$ that is used in the TLC-program operation.

Similarly, the bit $BIT_S$ corresponding to the program state $PV_S$ of the SLC-program operation may be identical to $MSB_T$ of the logic code corresponding to the first program state $PV1_T$ of the TLC-program operation.

By the means of the above-described scheme, respective states of the SLC-program operation and logic codes corresponding thereto may be configured, and the SLC-program operation may be performed by using the verify voltages, selected at step S430, at step S450. In this case, a read operation may be performed on the second physical page by using the read voltage $R_S$. Referring to FIGS. 13A and 13B together, the read voltage $R_S$ that is used in the read operation on the second physical page may be substantially identical to the first read voltage $R1_T$ that is used in the read operation on the first physical page.

Accordingly, the read operation may be performed on the SLC-programmed second physical page by using some read voltage $R1_T$, among the read voltages $R1_T$ to $R7_T$ that are used in the read operation on the TLC-programmed first physical page. Accordingly, the read operation on the TLC-programmed first physical page and the read operation on the SLC-programmed second physical page may be successively performed without changing read voltage values.

Descriptions made with reference to FIGS. 5 to 13B are summarized as follows. That is, in the case in which physical pages that are programmed through different program schemes, as illustrated in FIG. 4, are present in one memory block, a read operation may be performed on an MLC-programmed page or an SLC-programmed page by using a read voltage that is used in a read operation on a TLC-programmed page.

Figure 14A:
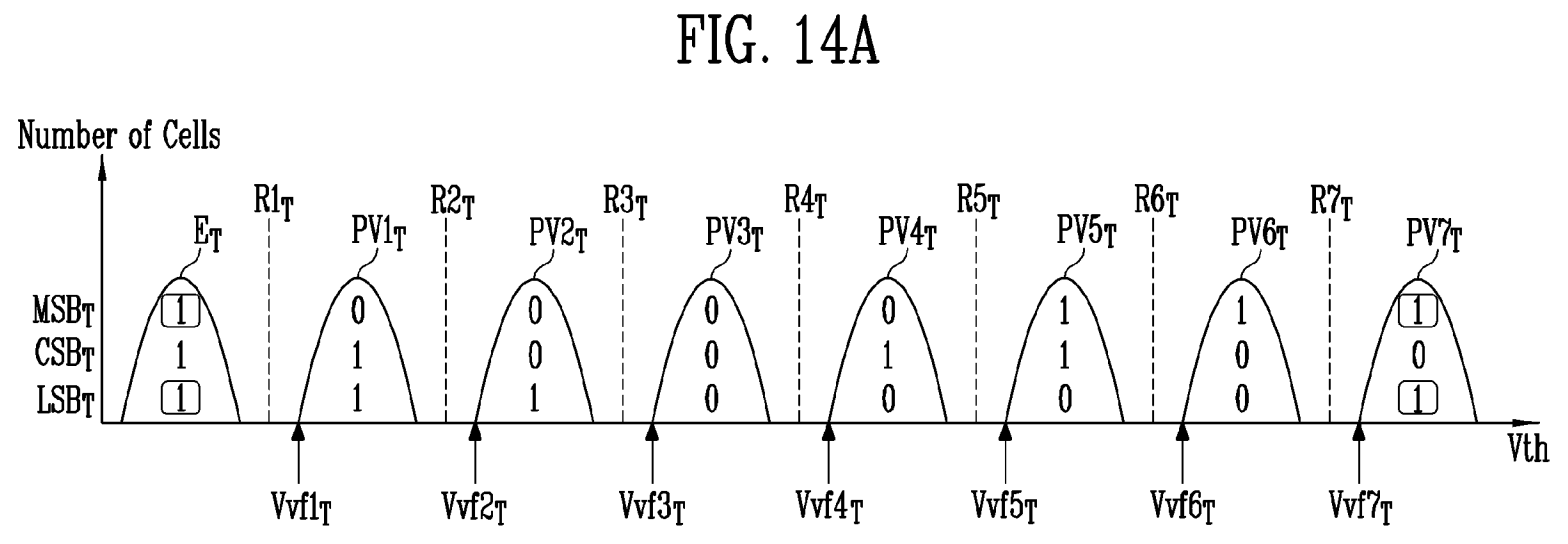
Figure 14B:
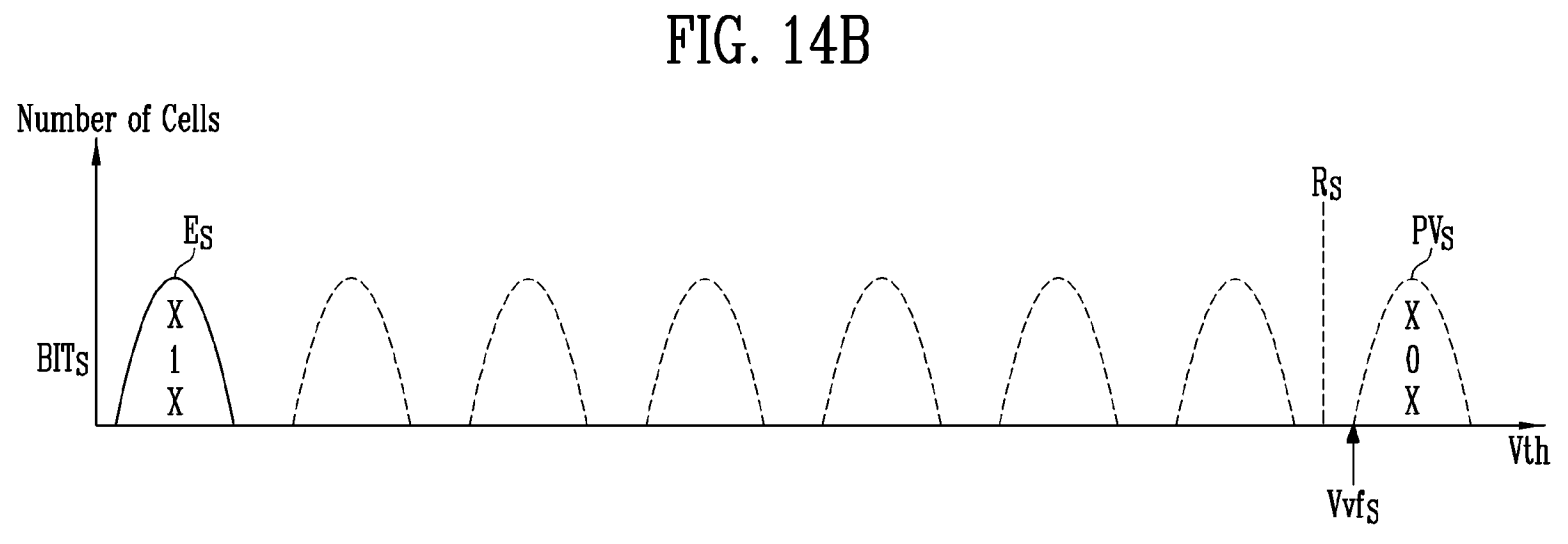

FIG. 14A is a diagram illustrating examples of steps S410 and S430 of FIG. 12. FIG. 14B is a diagram illustrating an example of step S450 of FIG. 12. In detail, FIGS. 14A and 14B are diagrams for explaining a TLC-program operation and an SLC-program operation in the case in which H is 1 and K is 3.

Referring to FIG. 14A, $2^{N-2}$ states in which H-th and K-th bits, among first to N-th bits that are stored in each of memory cells included in the first physical page at step S410, are 1 may be selected. In detail, at step S410, two states in which first and third bits are 1 may be selected. States in which $MSB_T$ and $LSB_T$ are 1 may be an erased state $E_T$ and a seventh program state $PV7_T$. That is, at step S410, two states $E_T$ and PV71 in which $MSB_T$ and $LSB_T$ are 1 may be selected from among the states $E_T$ and $PV1_T$ to $PV7_T$ that are formed by the TLC-program operation.

At step S430, a verify voltage corresponding to an upper one state of the selected two states $E_T$ and $PV7_T$ may be selected. The erased state $E_T$, which is the lowest state of the selected two states $E_T$ and $PV7_T$, may correspond to the erased state $E_M$ in the MLC-program operation. Therefore, at step S430, a verify voltage $Vvf7_T$ corresponding to the upper state $PV7_T$ may be selected.

At step S450, the memory cells included in the second physical page may be programmed by using the verify voltage $Vvf7_T$ that is selected at step S430 so that the threshold voltage of each of the memory cells belongs to any one of the erased state and the program states. It can be seen that the verify voltage $Vvf_S$ that is used in the SLC-program operation may be substantially identical to the verify voltage $Vvf7_T$ selected at step S430. Meanwhile, the bit $BIT_S$ corresponding to the erased state $E_S$ of the SLC-program operation may be identical to $CSB_T$ of the logic code corresponding to the erased state $E_T$ of the TLC-program operation. At step S410, because states in which $MSB_T$ and $LSB_T$ are 1 are selected from among the states of the TLC-program operation, the bit $BIT_S$ that is used in the SLC-program operation may be configured by using $CSB_T$ that is used in the TLC-program operation.

Similarly, the bit $BIT_S$ corresponding to the program state $PV_S$ of the SLC-program operation may be identical to $CSB_T$ of the logic code corresponding to the seventh program state $PV7_T$ of the TLC-program operation.

Figure 16A:
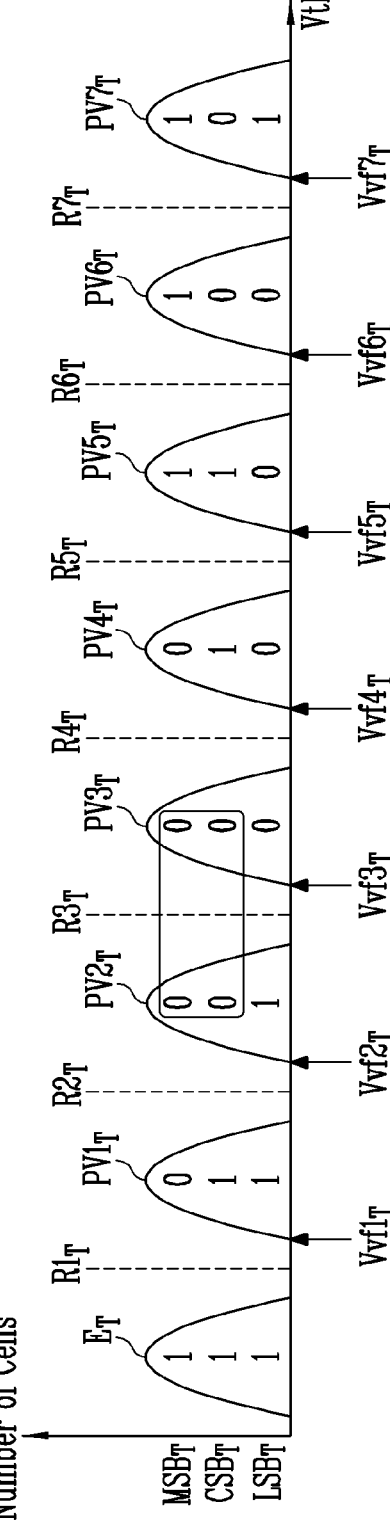
FIG. 16A is a diagram illustrating steps S420 and S430 of FIG. 15.
Figure 16B:
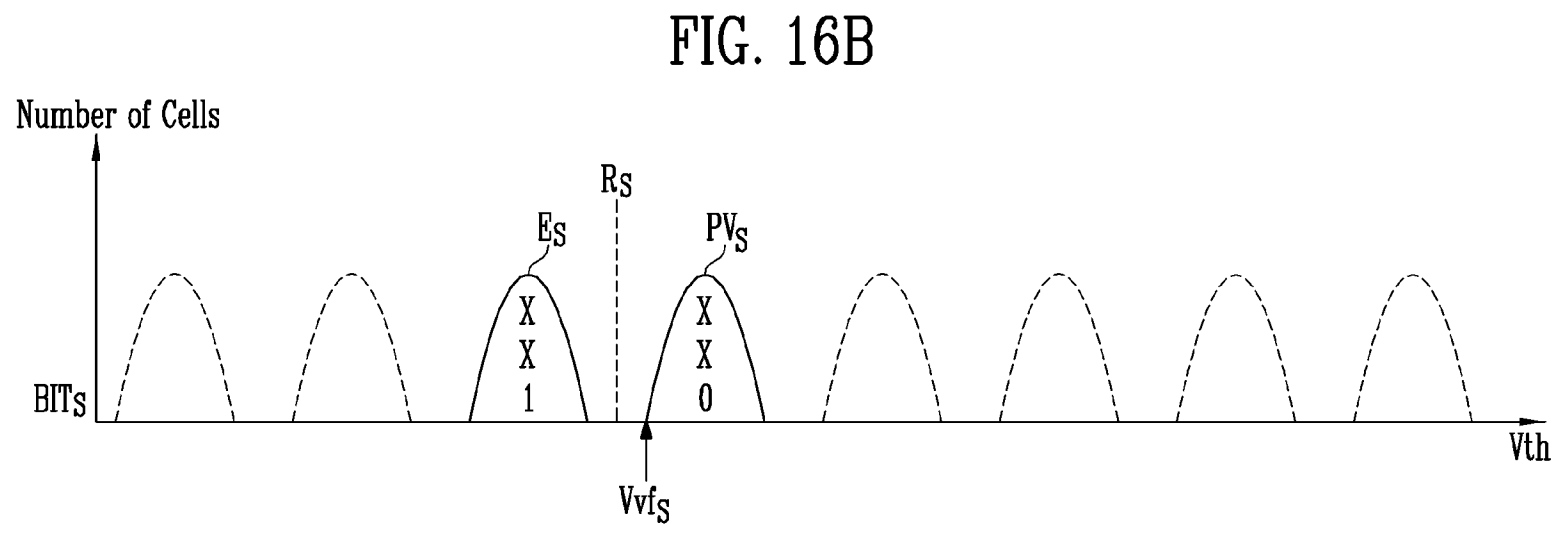
Figure 16C:
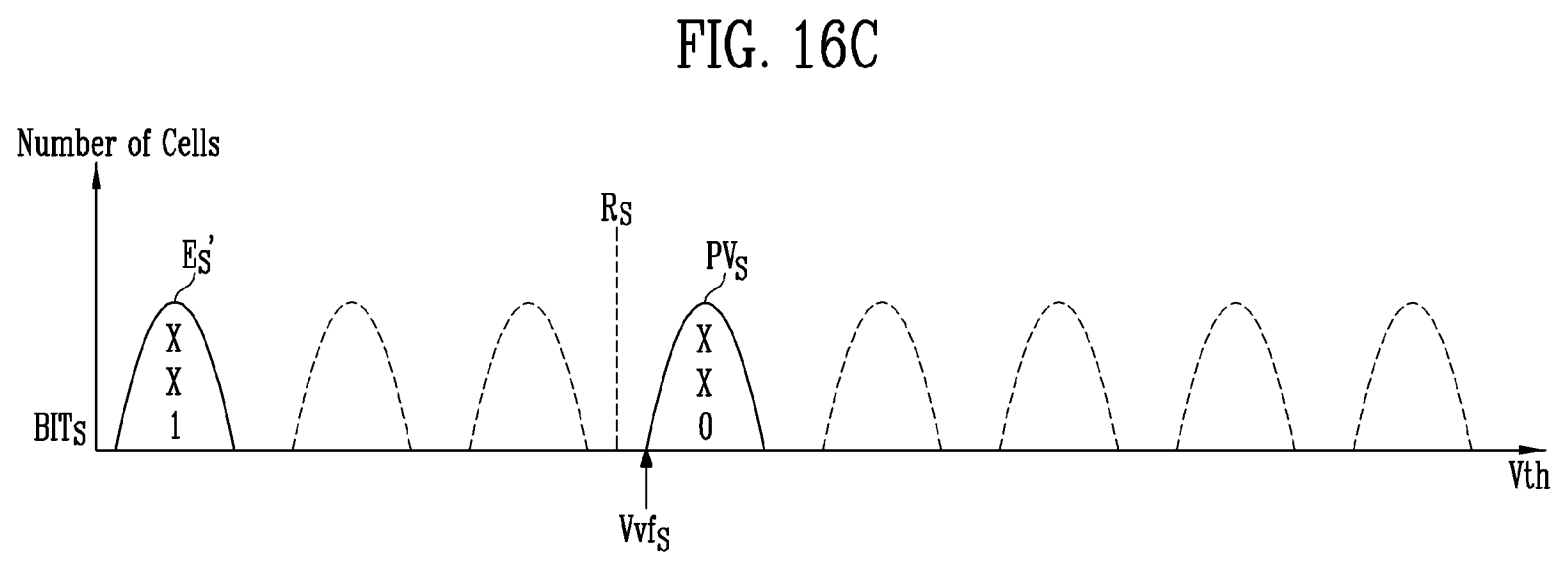

FIG. 15 is a flowchart illustrating an embodiment of step S400 of FIG. 11. FIG. 16A is a diagram illustrating steps S420 and S430 of FIG. 15. FIGS. 16B and 16C are diagrams illustrating step S450 of FIG. 15. Hereinafter, an embodiment of step S400 will be described with reference to FIGS. 15, 16A, 16B, and 16C together.

Referring to FIG. 15, step 400 of FIG. 11 may include step S420 of selecting $2^{N-2}$ states in which an H-th bit and a K-th bit, among first to N-th bits that are stored in each of the memory cells included in the first physical page, are 0, step S430 of selecting $(2^{N-2}-1)$ verify voltages corresponding to upper $(2^{N-2}-1)$ states, among the selected states, and step S450 of programming memory cells included in the second physical page by using the selected verify voltages so that the threshold voltage of each of the memory cells belongs to any one of the erased state and the first to $(2^{N-2}-1)$-th program states.

Referring to FIGS. 12 and 15 together, steps S430 and S450 illustrated in FIG. 15 are substantially identical to steps S430 and S450 illustrated in FIG. 12. Therefore, repeated descriptions of steps S430 and S450 will be omitted.

When N is 3, two states in which an H-th bit and a K-th bit, among first to third bits, that is, $MSB_T$, $CSB_T$, and $LSB_T$ that are stored in each memory cell included in the first physical page, are 0 may be selected at step S420. Unlike step S410 of FIG. 12, which illustrates states in which the H-th and K-th bits are 1 are selected, step S420 of FIG. may select the states in which the H-th and K-th bits are 0. For example, the case in which H is 1 and K is 2 may be assumed. In this case, at step S420, two states in which $MSB_T$ and $CSB_T$ are 0 may be selected.

Referring to FIG. 16A, states in which $MSB_T$ and $CSB_T$ are 0 may be a second program state $PV2_T$ and a third program state $PV3_T$. That is, at step S420, two states $PV2_T$ and $PV3_T$ in which $MSB_T$ and $CSB_T$ are 0 may be selected from among the states $E_T$ and $PV1_T$ to $PV7_T$ that are formed by the TLC-program operation.

At step S430, a verify voltage corresponding to an upper state of the selected two states $PV2_T$ and $PV3_T$ may be selected. The second program state $PV2_T$, which is the lower state of the selected two states $PV2_T$ and $PV3_T$, may correspond to the erased state $E_S$ of the SLC-program operation. Therefore, at step S430, a verify voltage $Vvf3_T$ corresponding to the upper state $PV3_T$ may be selected.

At step S450, the memory cells included in the second physical page may be programmed by using the verify voltage $Vvf3_T$ selected at step S430 so that the threshold voltage of each of the memory cells belongs to any one of the erased state and the program states.

In FIG. 16B, threshold voltage distributions of memory cells included in the second physical page depending on the SLC-program operation are illustrated. Referring to FIG. 16B, memory cells corresponding to a program state $PV_S$ may be programmed by using a verify voltage $Vvf_S$.

Referring to FIGS. 16A and 16B together, it can be seen that the verify voltage $Vvf_S$ that is used in the SLC-program operation may be substantially identical to the verify voltage $Vvf3_T$ that is selected at step S430.

Meanwhile, in FIG. 16B, a threshold voltage distribution corresponding to the erased state $E_S$ is illustrated as being substantially identical to a threshold voltage distribution corresponding to the second program state $PV2_T$, illustrated in FIG. 16A. However, in the SLC-program operation, threshold voltages of memory cells corresponding to the erased state $E_S$ might not increase. Therefore, after the SLC-program operation is completed, threshold voltage distributions of memory cells included in the second physical page may actually be formed, as illustrated in FIG. 16C. Referring to FIG. 16C, a threshold voltage distribution corresponding to an erased state $E_S$ after the SLC-program operation is completed may be substantially identical to that of the erased state $E_T$, illustrated in FIG. 16A.

Meanwhile, in threshold voltage distributions that are formed by the SLC-program operation, each of the erased state $E_S$ and the program state $PV_S$ may have logic codes corresponding thereto. More specifically, the logic code corresponding to each of the erased state $E_S$ and the program state $PV_S$ may be implemented as one bit $BIT_S$. In an embodiment illustrated in FIG. 16B, the bit $BIT_S$ corresponding to the erased state $E_S$ may be "1", and the bit $BIT_S$ corresponding to the program state $PV_S$ may be "0".

Referring to FIGS. 16A and 16B together, the bit $BIT_S$ corresponding to the erased state $E_S$ of the SLC-program operation may be identical to $LSB_T$ of the logic code corresponding to the second program state $PV2_T$ of the TLC-program operation. At step S410, because states in which $MSB_T$ and $CSB_T$ are 0 are selected from among the states of the TLC-program operation, the bit $BIT_S$ that is used in the SLC-program operation may be configured by using $LSB_T$ that is used in the TLC-program operation.

Similarly, the bit $BIT_S$ corresponding to the program state $PV_S$ of the SLC-program operation may be identical to $LSB_T$ of the logic code corresponding to the third program state $PV3_T$ of the TLC-program operation.

By means of the above-described scheme, respective states of the SLC-program operation and logic codes corresponding thereto may be configured, and the SLC-program operation may be performed by using the verify voltages, selected at step S430, at step S450. In this case, a read operation may be performed on the second physical page by using the read voltage $R_S$. Referring to FIGS. 16A and 16B together, the read voltage $R_S$ that is used in the read operation on the second physical page may be substantially identical to the third read voltage $R3_T$ that is used in the read operation on the first physical page.

Accordingly, the read operation may be performed on the SLC-programmed second physical page by using some read voltage $R3_T$, among the read voltages $R1_T$ to $R7_T$ that are used in the read operation on the TLC-programmed first physical page. Accordingly, the read operation on the TLC-programmed first physical page and the read operation on the SLC-programmed second physical page may be successively performed without changing read voltage values.

The present disclosure may provide a semiconductor memory device having improved read performance and a method of operating the semiconductor memory device.

What is claimed is:

1. A semiconductor memory device comprising:
   a first page including first memory cells, each storing N bits;
   a second page including second memory cells, each storing N−1 bits;
   a third page Including third memory cells, each storing N−2 bits;
   a peripheral circuit configured to perform a first program operation that results in a threshold voltage of each of the first memory cells to be included in any one of $2^N$ states, configured to perform a second program operation that results in a threshold voltage of each of the second memory cells to be included in any one of $2^{N-1}$ states, and configured to perform a third program operation that results in a threshold voltage of each of the third memory cells to be included in any one of $2^{N-2}$ states; and
   a control logic configured to control the first and second program operations through the peripheral circuit,
   wherein the control logic is configured to control the peripheral circuit to perform the second program operation by using at least one, but not all, of a plurality of verify voltages that are used in the first program operation, and
   wherein, during the first program operation, the control logic Is configured to control the peripheral circuit to program the first memory cells by using first to ($2^N$−1)-th verify voltages such that the threshold voltage of each of the first memory cells belongs to any one of an erased state and first to ($2^N$−1)-th program states,
   wherein the control logic is configured to control the peripheral circuit to perform the third program operation by using at least one, but not all, of the plurality of verify voltages that are used in the first program operation,
   wherein N is a natural number greater than or equal to 3.

2. The semiconductor memory device according to claim 1, wherein during the second program operation, the control logic is configured to:
   select $2^{N-1}$ states in which a K-th bit, among first to N-th bits that are stored in each of the first memory cells, is 1 from among the erased state and the first to ($2^N$−1)-th program states,
   select ($2^{N-1}$−1) verify voltages, respectively corresponding to upper ($2^{N-1}$−1) states, among the selected $2^{N-1}$ states, from among the first to ($2^N$−1)-th verify voltages that are used in the first program operation, and
   control the peripheral circuit to perform the second program operation by using the selected ($2^{N-1}$−1) verify voltages,
   wherein K is a natural number that is greater than or equal to 1 and less than or equal to N.

3. The semiconductor memory device according to claim 2, wherein the control logic is configured to control the peripheral circuit to perform a read operation on the first page by using first to ($2^N$−1)-th read voltages.

4. The semiconductor memory device according to claim 3, wherein the control logic is configured to:
   select ($2^{N-1}$−1) read voltages from among the first to ($2^N$−1)-th read voltages, and
   control the peripheral circuit to perform a read operation on the second page by using the selected ($2^{N-1}$−1) read voltages.

5. The semiconductor memory device according to claim 1, wherein, during the second program operation, the control logic is configured to:

select $2^{N-1}$ states in which a K-th bit, among first to N-th bits that are stored in each of the first memory cells, is 0 from among the erased state and the first to $(2^N-1)$-th program states, select $(2^{N-1}-1)$ verify voltages, respectively corresponding to upper $(2^{N-1}-1)$ states, among the selected $2^{N-1}$ states, from among the first to $(2^N-1)$-th verify voltages that are used in the first program operation, and control the peripheral circuit to perform the second program operation by using the selected $(2^{N-1}-1)$ verify voltages, wherein K is a natural number that is greater than or equal to 1 and less than or equal to N.

6. The semiconductor memory device according to claim 1, wherein during the third program operation, the control logic is configured to:

select $2^{N-2}$ states in which an H-th bit and a K-th bit, among first to N-th bits that are stored in each of the first memory cells, are 1 from among the erased state and first to $(2^N-1)$-th program states, select $(2^{N-2}-1)$ verify voltages, respectively corresponding to upper $(2^{N-2}-1)$ states, among the selected $2^{N-2}$ states, from among the first to $(2^N-1)$-th verify voltages, and control the peripheral circuit to perform the third program operation by using the selected $(2^{N-2}-1)$ verify voltages, wherein H is a natural number that is greater than or equal to 1 and less than or equal to N, and wherein K is a number that is different from H, among natural numbers that are greater than or equal to 1 and less than or equal to N.

7. The semiconductor memory device according to claim 6, wherein the control logic is configured to:

control the peripheral circuit to perform a read operation on the first page by using first to $(2^N-1)$-th read voltages, select $(2^{N-2}-1)$ read voltages from among the first to $(2^N-1)$-th read voltages, and control the peripheral circuit to perform a read operation on the third page by using the selected $(2^{N-2}-1)$ read voltages.

8. The semiconductor memory device according to claim 1, wherein, during the second program operation, the control logic is configured to:

select $2^{N-2}$ states in which in which a H-th bit and a K-th bit, among first to N-th bits that are stored in each of the first memory cells, are 0 from among the erased state and the first to $(2^N-1)$-th program states, select $(2^{N-2}-1)$ verify voltages, respectively corresponding to upper $(2^{N-2}-1)$ states, among the selected $2^{N-2}$ states, from among the first to $(2^N-1)$-th verify voltages, and control the peripheral circuit to perform the third program operation by using the selected $(2^{N-2}-1)$ verify voltages, wherein H is a natural number that is greater than or equal to 1 and less than or equal to N, and wherein K is a number that is different from H, among natural numbers that are greater than or equal to 1 and less than or equal to N.

9. A method of operating a semiconductor memory device, the method comprising:

performing a first program operation on a first page including first memory cells, each storing N bits; and performing a second program operation on a second page including second memory cells, each storing N-M bits, using at least one, but not all, of a plurality of verify voltages that are used in the first program operation, wherein performing the first program operation comprises programming the first memory cells by using first to $(2^N-1)$-th verify voltages such that a threshold voltage of each of the first memory cells is included in any one of an erased state and first to $(2^N-1)$-th program states, and wherein M is 2, and performing the second program operation comprises:

selecting $2^{N-2}$ states in which an H-th bit and a K-th bit, among first to N-th bits that are stored in each of the first memory cells, are 1 from among the erased state and first to $(2^N-1)$-th program states;

selecting $(2^{N-2}-1)$ verify voltages, respectively corresponding to upper $(2^{N-2}-1)$ states, among the selected $2^{N-2}$ states, from among the first to $(2^{N-1})$-th verify voltages that are used in the first program operation; and performing a program operation on the second memory cells by using the selected $(2^{N-2}-1)$ verify voltages such that a threshold voltage of each of the second memory cells is included in any one of the $2^{N-2}$ states, wherein H is a natural number that is greater than or equal to 1 and less than or equal to N, and wherein K is a number that is different from H, among natural numbers that are greater than or equal to 1 and less than or equal to N.

10. A method of operating a semiconductor memory device, comprising:

performing a first program operation on a first page including first memory cells, each storing N bits; and performing a second program operation on a second page including second memory cells, each storing N-M bits, using at least one, but not all, of a plurality of verify voltages that are used in the first program operation, wherein N is a natural number greater than or equal to 2, wherein performing the first program operation comprises programming the first memory cells by using first to $(2^N-1)$-th verify voltages such that a threshold voltage of each of the first memory cells is included in any one of an erased state and first to $(2^N-1)$-th program states, wherein M is 2, and performing the second program operation comprises:

selecting $2^{N-2}$ states in which an H-th bit and a K-th bit, among first to N-th bits that are stored in each of the first memory cells, are 0 from among the erased state and first to $(2^N-1)$-th program states;

selecting $(2^{N-2}-1)$ verify voltages, respectively corresponding to upper $(2^{N-2}-1)$ states, among the selected $2^{N-2}$ states, from among the first to $(2^N-1)$-th verify voltages that are used in the first program operation; and performing a program operation on the second memory cells by using the selected $(2^{N-2}-1)$ verify voltages such that a threshold voltage of each of the second memory cells is included in any one of the $2^{N-2}$ states;

wherein H is a natural number that is greater than or equal to 1 and less than or equal to N; and wherein K is a number different from H, among natural numbers that are greater than or equal to 1 and less than or equal to N.

* * * * *